(12) United States Patent
Xie et al.

(10) Patent No.: US 12,538,553 B2
(45) Date of Patent: Jan. 27, 2026

(54) CONTACT STRUCTURE FOR POWER DELIVERY ON SEMICONDUCTOR DEVICE

(71) Applicant: International Business Machines Corporation, Armonk, NY (US)

(72) Inventors: Ruilong Xie, Niskayuna, NY (US); Huai Huang, Clifton Park, NY (US); Lawrence A. Clevenger, Saratoga Springs, NY (US); Koichi Motoyama, Clifton Park, NY (US); Nicholas Anthony Lanzillo, Wynantskill, NY (US); Hosadurga Shobha, Niskayuna, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 536 days.

(21) Appl. No.: 18/066,243

(22) Filed: Dec. 14, 2022

(65) Prior Publication Data

US 2024/0204067 A1 Jun. 20, 2024

(51) Int. Cl.
*H10D 64/23* (2025.01)
*H01L 23/528* (2006.01)
(Continued)

(52) U.S. Cl.
CPC ....... *H10D 64/256* (2025.01); *H01L 23/5286* (2013.01); *H10D 30/6735* (2025.01);
(Continued)

(58) Field of Classification Search
CPC .......... H10D 30/6735; H10D 84/0186; H10D 64/256; H10D 62/121; H10D 84/038; H01L 23/5286
See application file for complete search history.

(56) References Cited

U.S. PATENT DOCUMENTS 10,872,818 B2   12/2020   Chiang
11,289,606 B2    3/2022   Ju
(Continued)

FOREIGN PATENT DOCUMENTS

CN   111106059 A    5/2020
CN   112018040 A   12/2020
(Continued)

OTHER PUBLICATIONS

Bobba, et al., "Performance Analysis of 3-D Monolithic Integrated Circuits", 2010 IEEE International 3D Systems Integration Conference (3DIC), Nov. 16-18, 2010 , 4 pages, <https://ieeexplore.ieee.org/document/5751465>.
(Continued)

*Primary Examiner* — Changhyun Yi
(74) *Attorney, Agent, or Firm* — Scott Dobson

(57) ABSTRACT

A semiconductor structure with improved backside metal contacts includes a plurality of source/drain regions within a field effect transistor. A backside metal contact is electrically connected to at least one source/drain region of the plurality of source/drain regions. The backside metal contact includes a first taper profile. The semiconductor structure further includes a backside power rail electrically connected to the at least one source/drain region through the backside metal contact. The backside power rail includes a second taper profile that is different from the first taper profile.

20 Claims, 37 Drawing Sheets

Section X

(51) Int. Cl.
  *H10D 30/67* (2025.01)
  *H10D 62/10* (2025.01)
  *H10D 84/01* (2025.01)
  *H10D 84/03* (2025.01)

(52) U.S. Cl.
  CPC ....... *H10D 62/121* (2025.01); *H10D 84/0186* (2025.01); *H10D 84/038* (2025.01)

(56) References Cited

U.S. PATENT DOCUMENTS

| | | | |
|---|---|---|---|
| 11,387,181 | B2 | 7/2022 | Chou |
| 11,563,083 | B2 | 1/2023 | Chang |
| 2020/0411436 | A1 | 12/2020 | Xie |
| 2021/0111115 | A1 | 4/2021 | Morrow |
| 2021/0134721 | A1 | 5/2021 | Chiang |
| 2021/0202385 | A1 | 7/2021 | Huang |
| 2021/0305252 | A1 | 9/2021 | Chiang |
| 2021/0305381 | A1 | 9/2021 | Chiang |
| 2021/0343646 | A1 | 11/2021 | Chen |
| 2021/0351303 | A1 | 11/2021 | Ju |
| 2021/0375861 | A1 | 12/2021 | Chung |
| 2021/0376071 | A1 | 12/2021 | Liu |
| 2021/0376093 | A1 | 12/2021 | Chu |
| 2021/0376155 | A1 | 12/2021 | Chang |
| 2022/0157956 | A1 | 5/2022 | Chen et al. |
| 2022/0199468 | A1 | 6/2022 | Jun et al. |
| 2022/0359679 | A1 | 11/2022 | Lu et al. |
| 2022/0367727 | A1 | 11/2022 | Chang et al. |
| 2023/0253293 | A1* | 8/2023 | Cho .................. H10D 30/6735 257/732 |
| 2023/0326813 | A1* | 10/2023 | Hong ................ H01L 23/5286 |
| 2023/0343839 | A1* | 10/2023 | Kim .................... H01L 23/481 |

FOREIGN PATENT DOCUMENTS

| | | |
|---|---|---|
| CN | 113178444 A | 7/2021 |
| CN | 113363205 A | 9/2021 |
| CN | 113764414 A | 12/2021 |
| CN | 114220809 A | 3/2022 |
| CN | 114664789 A | 6/2022 |
| CN | 115084019 A | 9/2022 |
| DE | 102020119415 A1 | 12/2021 |
| DE | 112022005536 T5 | 10/2024 |

OTHER PUBLICATIONS

Fahad, et al., "Silicon Nanotube Field Effect Transistor with Core—Shell Gate Stacks for Enhanced High-Performance Operation and Area Scaling Benefits", Nano Letters, Issue 11, 2011, pp. 4393-4399, <https://pubs.acs.org/doi/abs/10.1021/nl202563s>.

"Patent Cooperation Treaty PCT Notification of Transmittal of the International Search Report and the Written Opinion of the International Searching Authority, or the Declaration", Applicant's file reference PF230632PCT, International application No. PCT/CN2023/133218, International filing date Nov. 22, 2023, Date of mailing Dec. 20, 2023, 8 pages.

German Patent and Trademark Office, "Office Action," Jul. 10, 2025, 12 Pages, DE Application No. 112023004601.8.

* cited by examiner

Section Y1

Section Y1

Section Y1

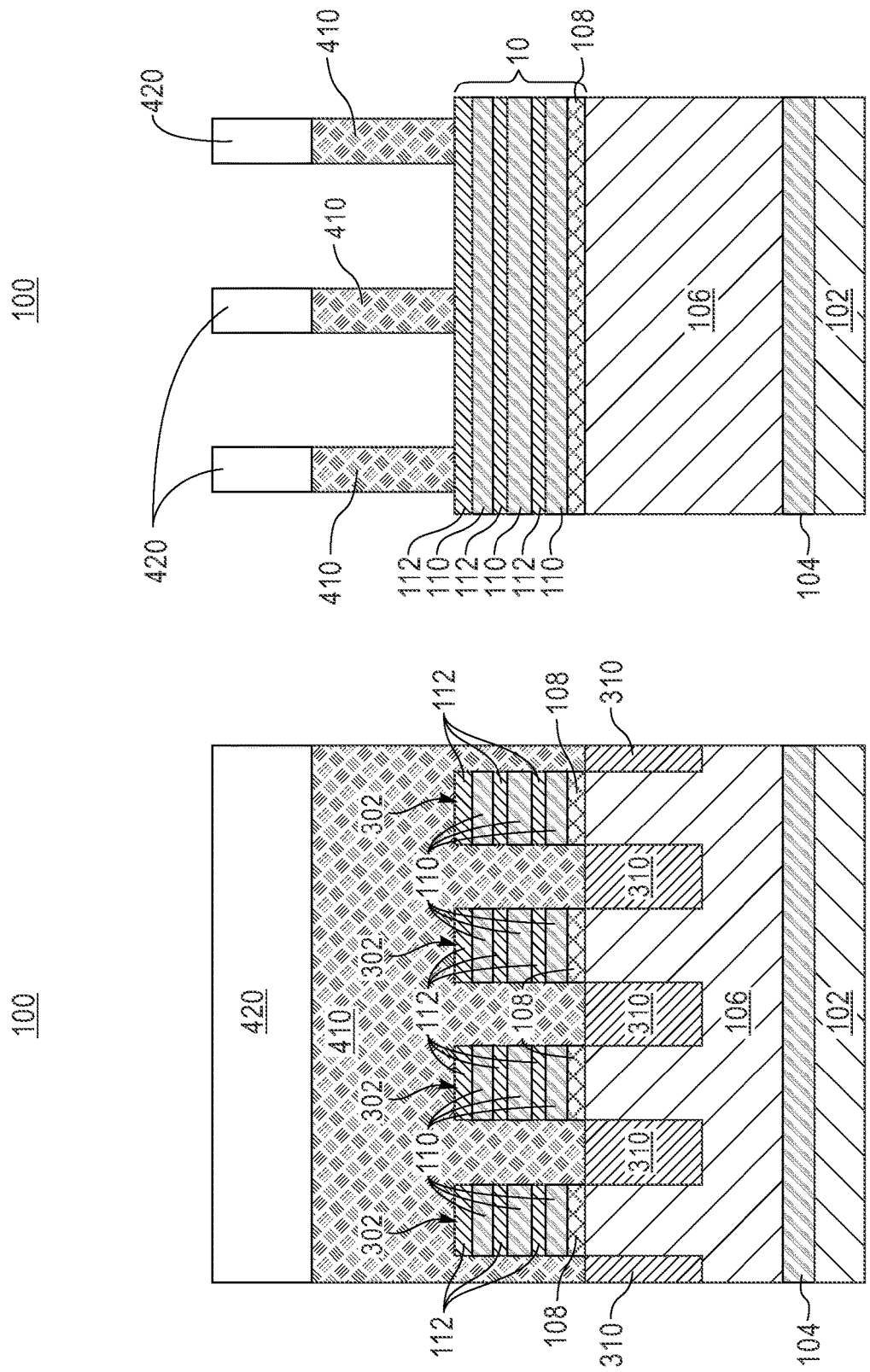

Section Y1

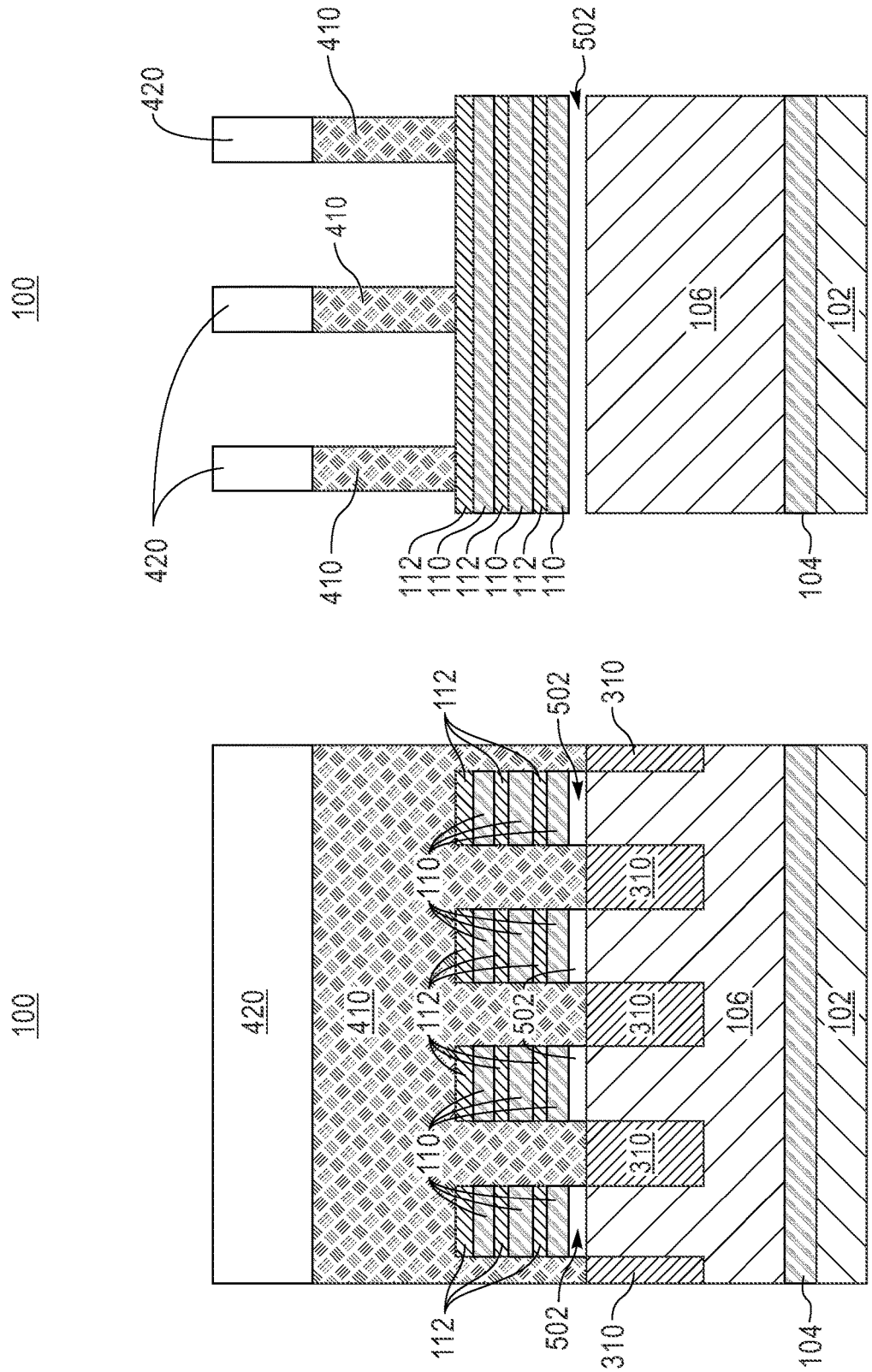

Section Y1

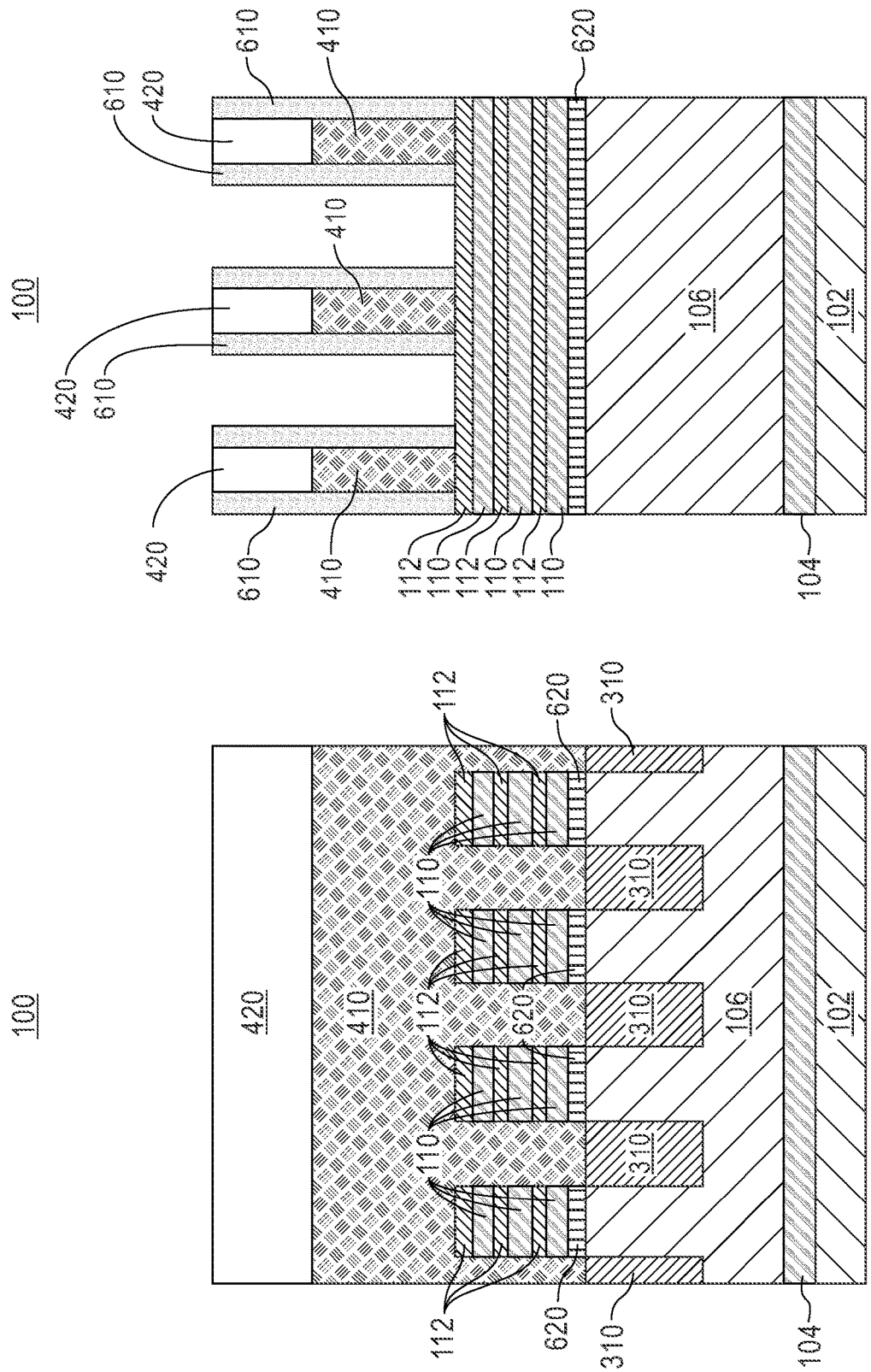

Section Y1

Section Y1

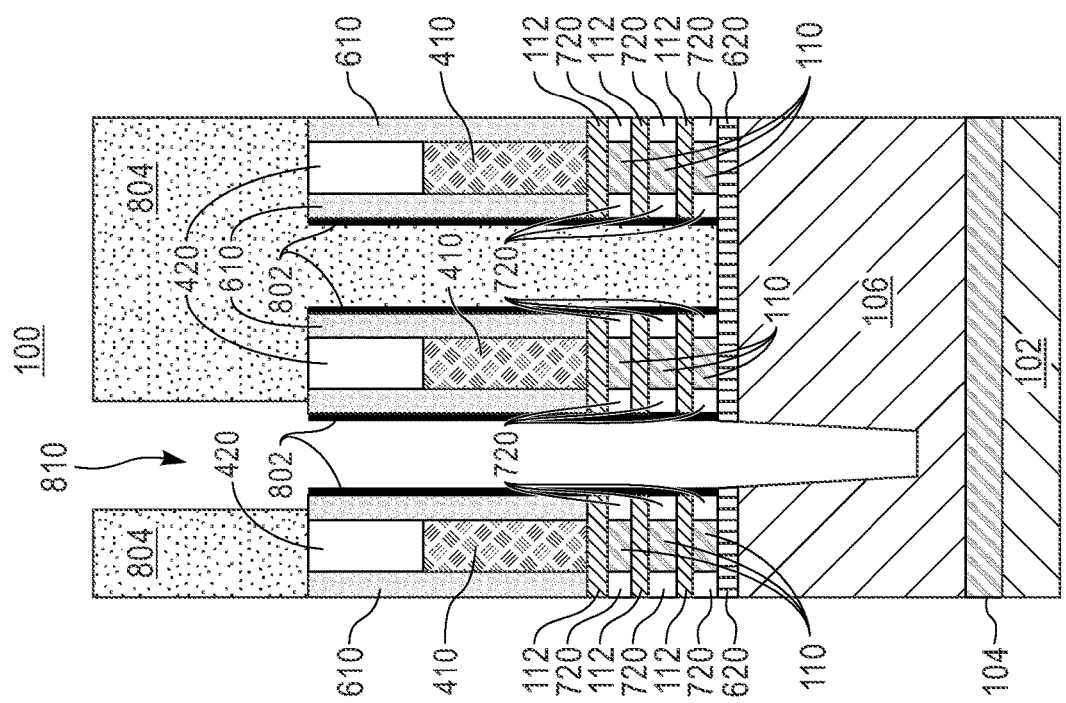
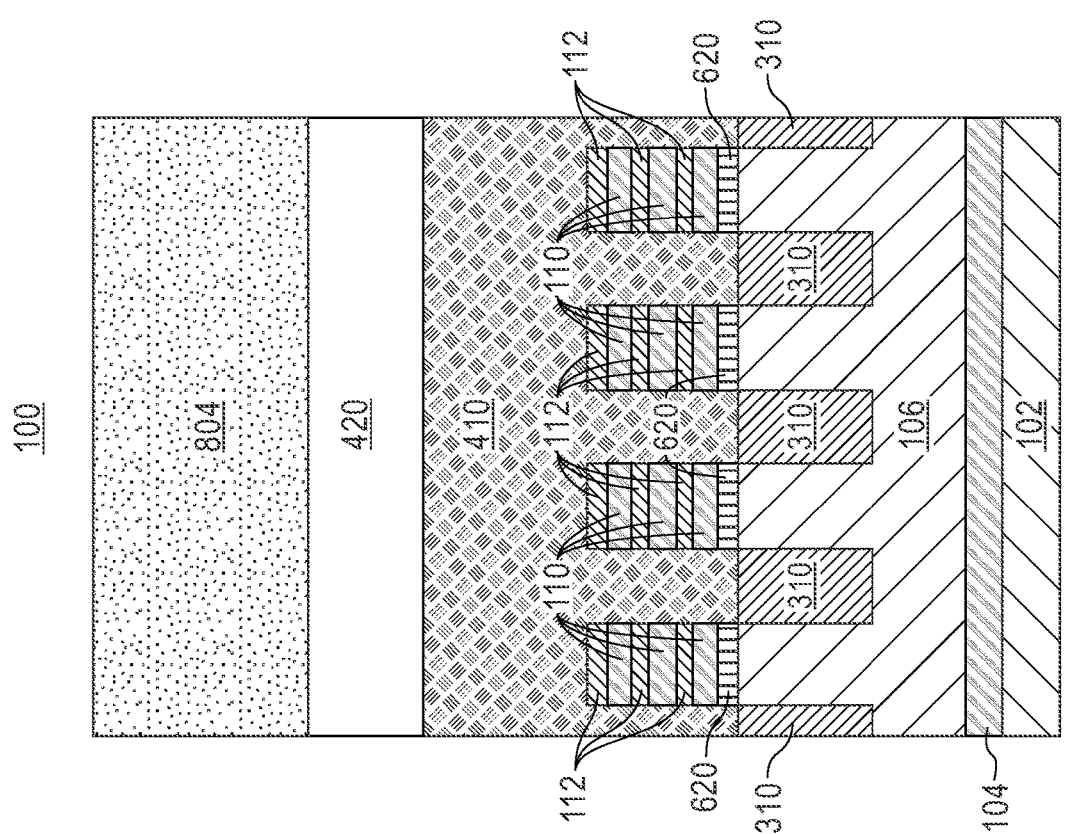

Section Y1

Section Y1

Section Y1

Section Y1

Section Y1

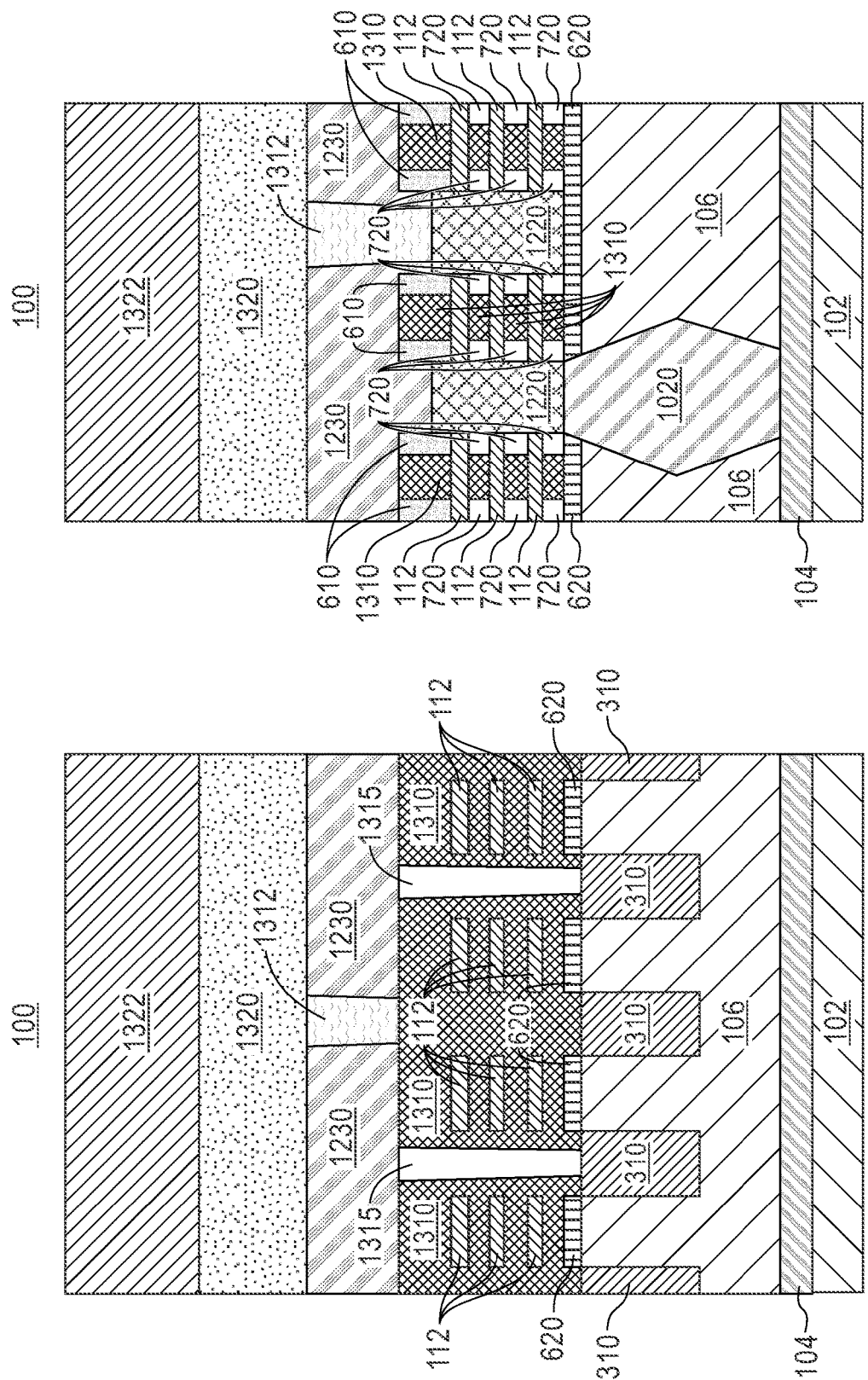

Section Y1

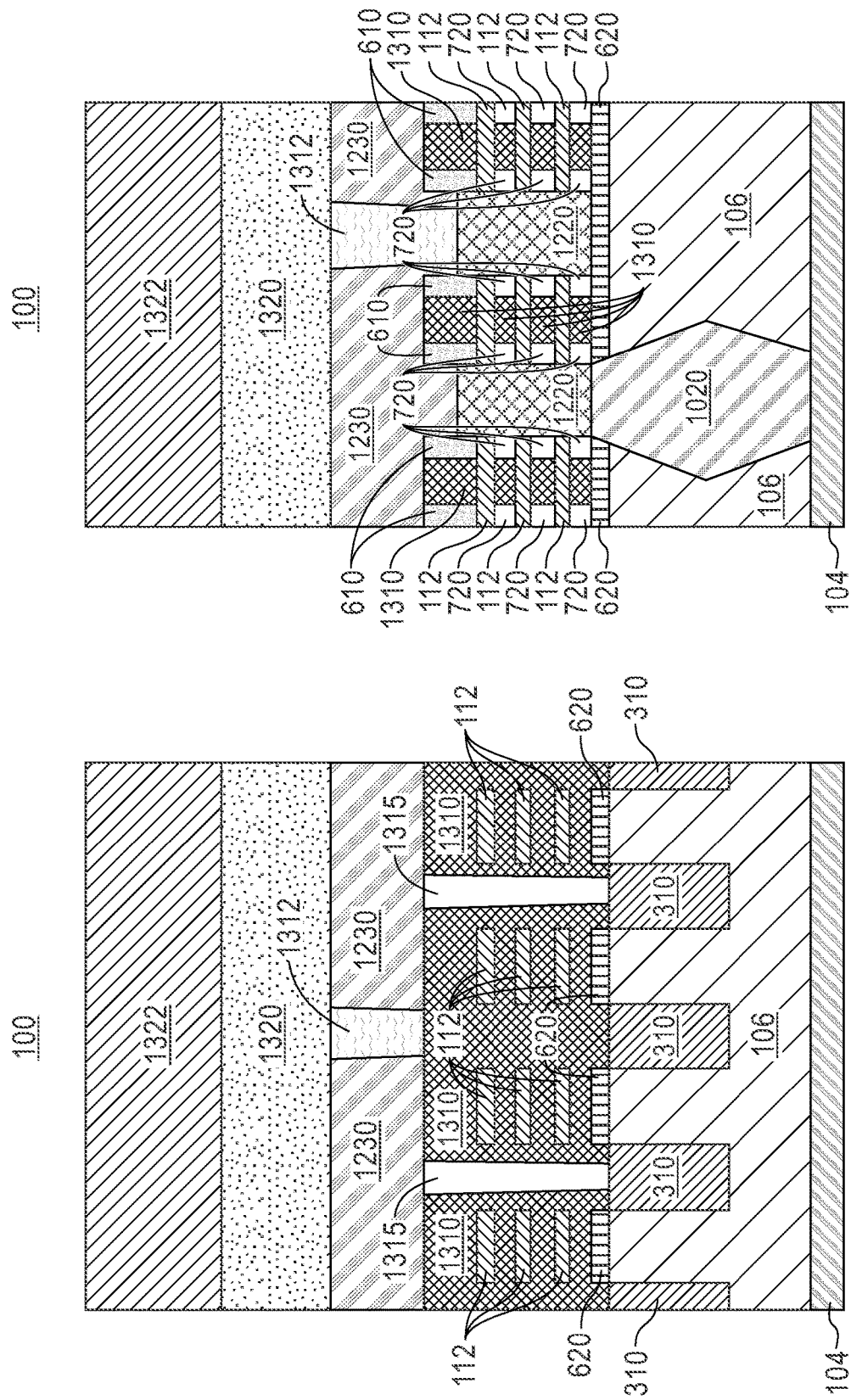

Section Y1

Section Y1

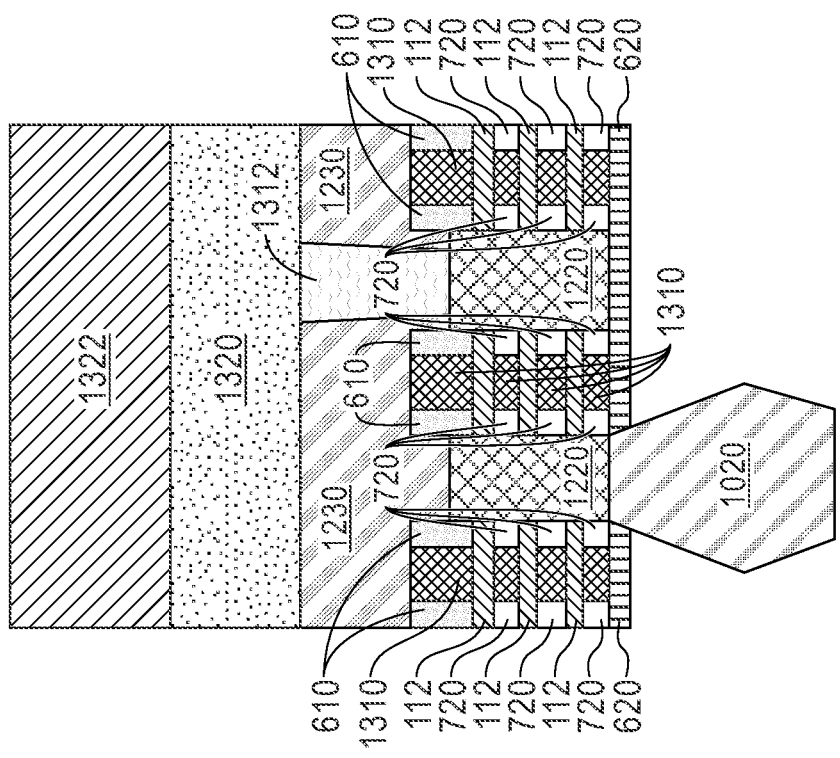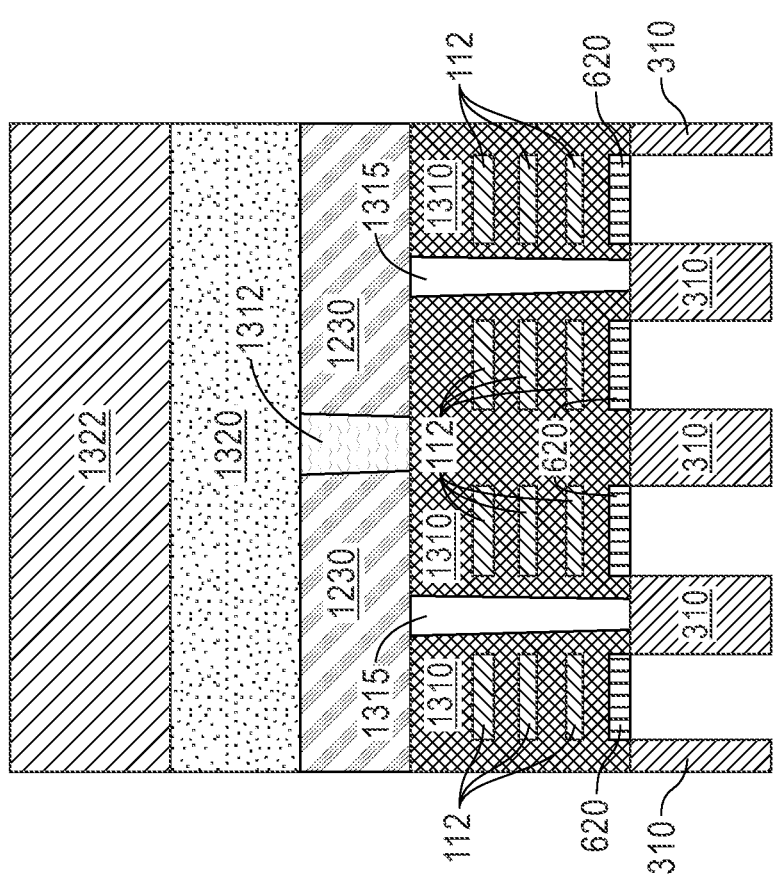

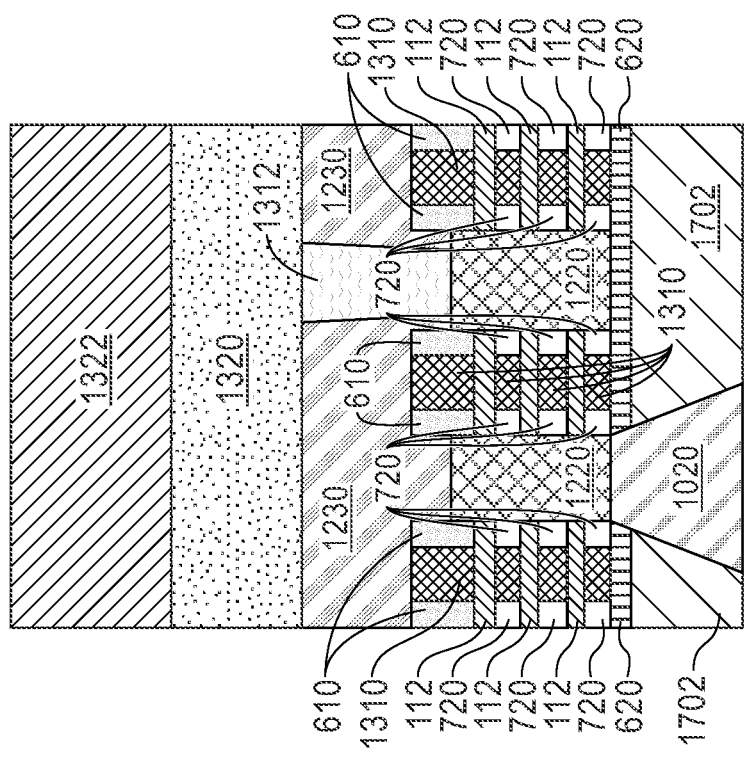
FIG. 17C Section X
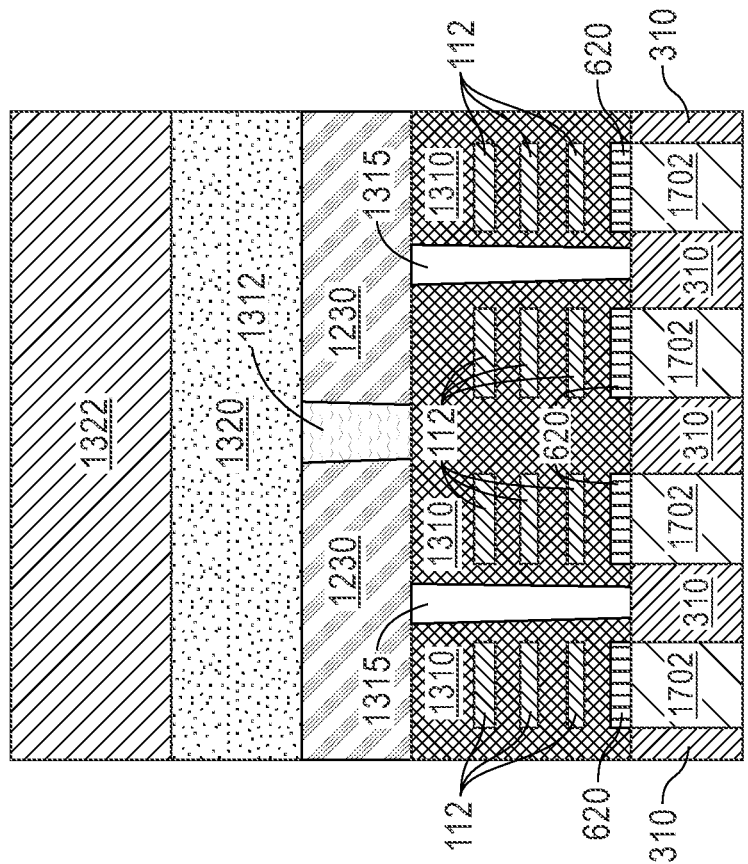
FIG. 17B Section Y2

Section Y1

Section Y1

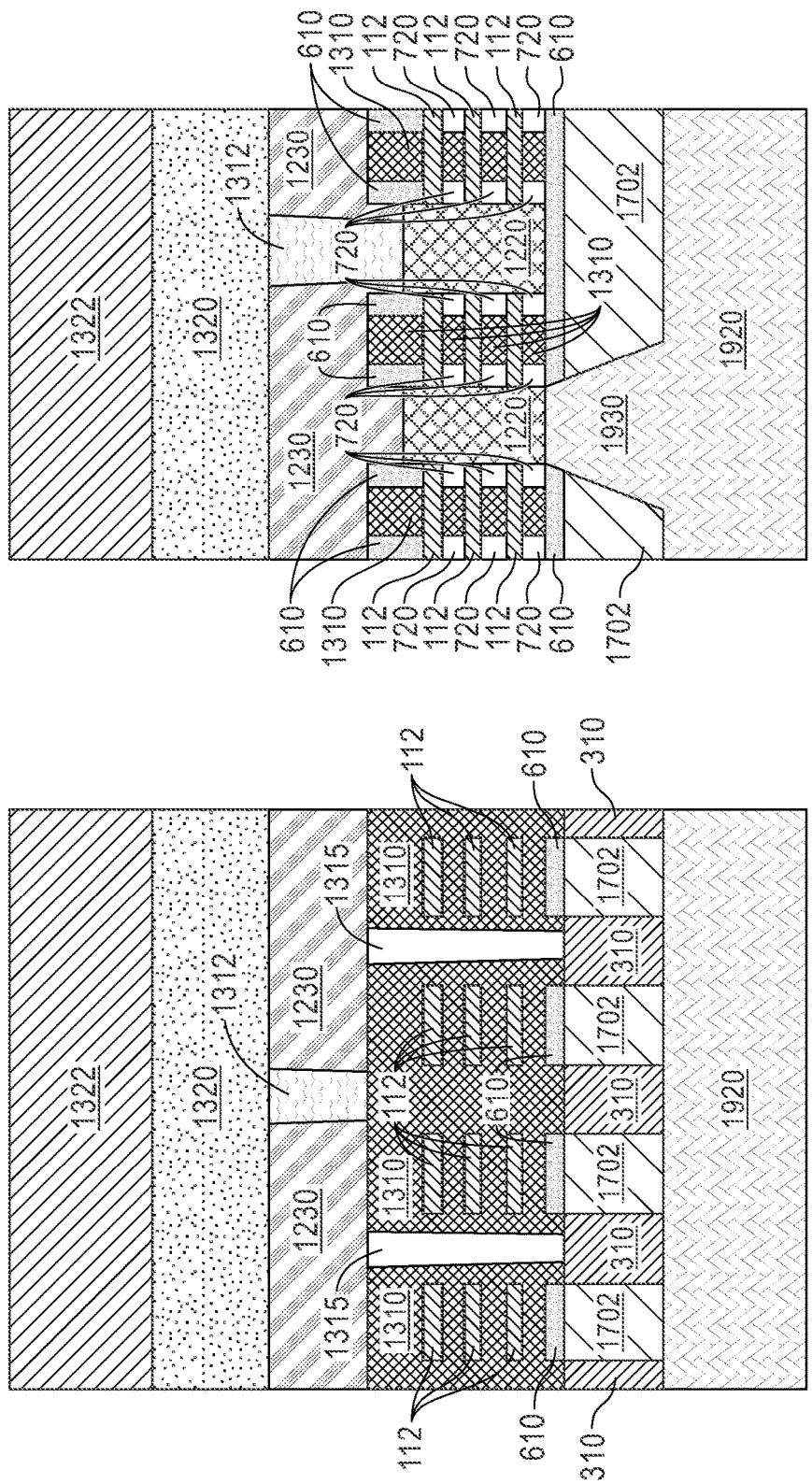

Section Y1

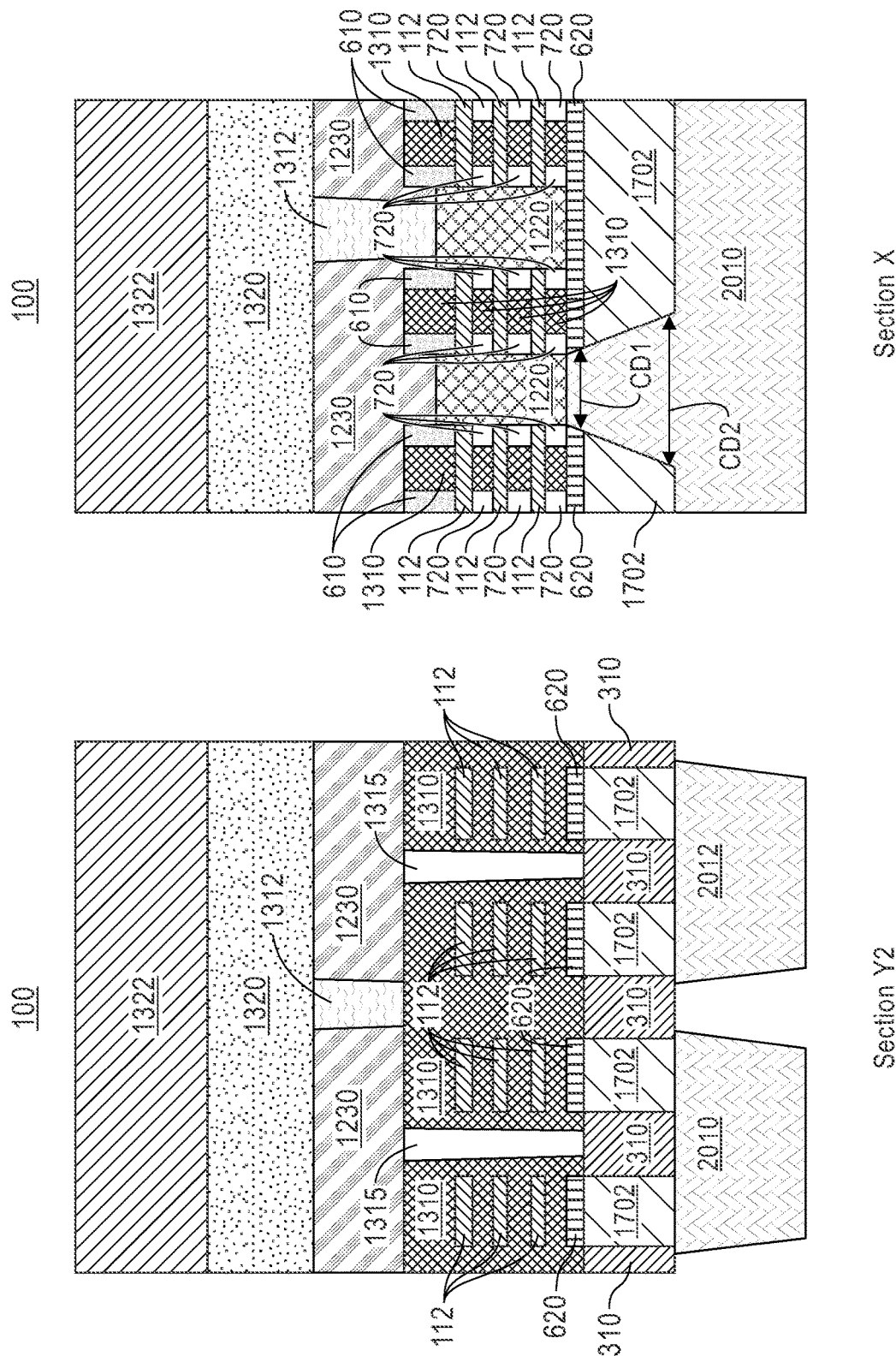

Section Y1

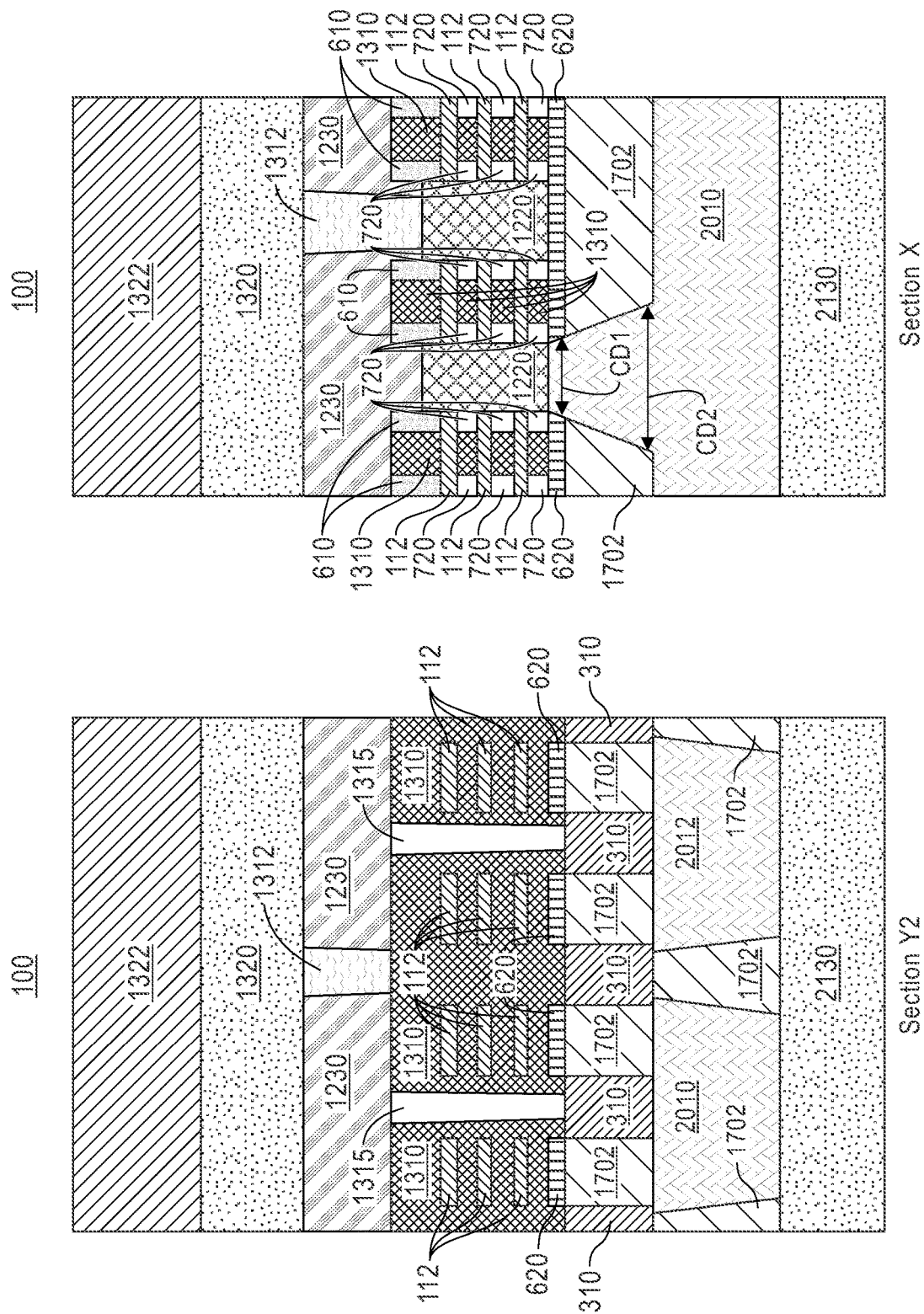

CONTACT STRUCTURE FOR POWER DELIVERY ON SEMICONDUCTOR DEVICE

BACKGROUND

The present invention generally relates to the field of semiconductor devices, and more particularly to power delivery to active devices.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops. Although existing approaches in semiconductor fabrication have been generally adequate for their intended purposes, they have not been entirely satisfactory in all respects. One particular area of interest includes forming metal contacts on the backside of the ICs.

SUMMARY

According to an embodiment of the present disclosure, a semiconductor structure includes a plurality of source/drain regions within a field effect transistor, a backside metal contact electrically connected to at least one source/drain region of the plurality of source/drain regions, the backside metal contact including a first taper profile, and a backside power rail electrically connected to the at least one source/drain region through the backside metal contact, the backside power rail including a second taper profile, the second taper profile being different from the first taper profile.

According to another embodiment of the present disclosure, a method of forming a semiconductor structure includes forming a plurality of source/drain regions within a field effect transistor, forming a backside metal contact electrically connected to at least one source/drain region of the plurality of source/drain regions, the backside metal contact including a first taper profile, and forming a backside power rail electrically connected to the at least one source/drain region through the backside metal contact, the backside power rail including a second taper profile, the second taper profile being different from the first taper profile.

BRIEF DESCRIPTION OF THE DRAWINGS

The following detailed description, given by way of example and not intended to limit the invention solely thereto, will best be appreciated in conjunction with the accompanying drawings, in which:

FIG. 4B is a cross-sectional view of the semiconductor structure taken along line Y2-Y2', as shown in FIG. 1, according to an embodiment of the present disclosure;

FIG. 4C is a cross-sectional view of the semiconductor structure taken along line X-X', according to an embodiment of the present disclosure;

FIG. 5B is a cross-sectional view of the semiconductor structure taken along line Y2-Y2', as shown in FIG. 1, according to an embodiment of the present disclosure;

FIG. 5C is a cross-sectional view of the semiconductor structure taken along line X-X', according to an embodiment of the present disclosure;

FIG. 6B is a cross-sectional view of the semiconductor structure taken along line Y2-Y2', as shown in FIG. 1, according to an embodiment of the present disclosure;

FIG. 6C is a cross-sectional view of the semiconductor structure taken along line X-X', according to an embodiment of the present disclosure;

FIG. 8B is a cross-sectional view of the semiconductor structure taken along line Y2-Y2', as shown in FIG. 1, according to an embodiment of the present disclosure;

FIG. 8C is a cross-sectional view of the semiconductor structure taken along line X-X', according to an embodiment of the present disclosure;

FIG. 13B is a cross-sectional view of the semiconductor structure taken along line Y2-Y2', as shown in FIG. 1, according to an embodiment of the present disclosure;

FIG. 13C is a cross-sectional view of the semiconductor structure taken along line X-X', according to an embodiment of the present disclosure;

FIG. 14B is a cross-sectional view of the semiconductor structure taken along line Y2-Y2', as shown in FIG. 1, according to an embodiment of the present disclosure;

FIG. 14C is a cross-sectional view of the semiconductor structure taken along line X-X', according to an embodiment of the present disclosure;

FIG. 16B is a cross-sectional view of the semiconductor structure taken along line Y2-Y2', as shown in FIG. 1, according to an embodiment of the present disclosure;

FIG. 16C is a cross-sectional view of the semiconductor structure taken along line X-X', according to an embodiment of the present disclosure;

FIG. 17B is a cross-sectional view of the semiconductor structure taken along line Y2-Y2', as shown in FIG. 1, according to an embodiment of the present disclosure;

FIG. 17C is a cross-sectional view of the semiconductor structure taken along line X-X', according to an embodiment of the present disclosure;

FIG. 19B is a cross-sectional view of the semiconductor structure taken along line Y2-Y2', as shown in FIG. 1, according to an embodiment of the present disclosure;

FIG. 19C is a cross-sectional view of the semiconductor structure taken along line X-X', according to an embodiment of the present disclosure;

FIG. 20B is a cross-sectional view of the semiconductor structure taken along line Y2-Y2', as shown in FIG. 1, according to an embodiment of the present disclosure;

FIG. 20C is a cross-sectional view of the semiconductor structure taken along line X-X', according to an embodiment of the present disclosure;

FIG. 21B is a cross-sectional view of the semiconductor structure taken along line Y2-Y2', as shown in FIG. 1, according to an embodiment of the present disclosure; and FIG. 21C is a cross-sectional view of the semiconductor structure taken along line X-X', according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
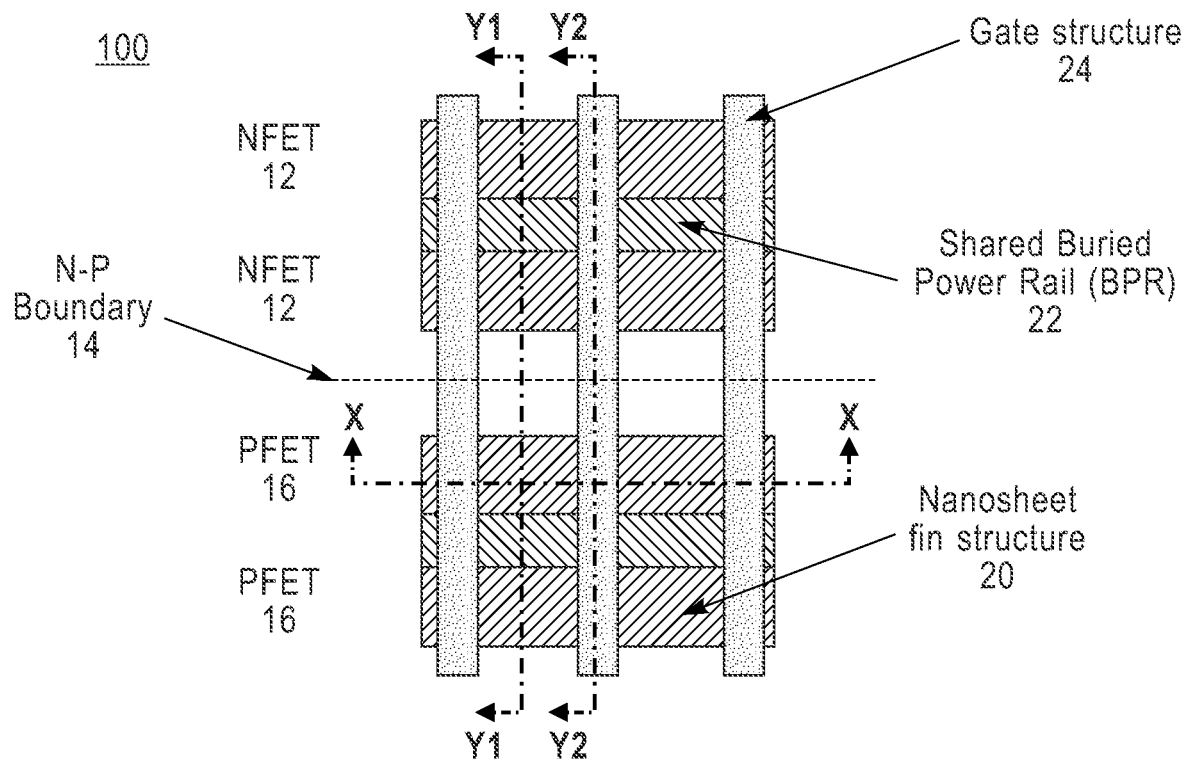
FIG. 1 is a top-down view of a semiconductor structure at an intermediate step during a semiconductor manufacturing process depicting different cross-sectional views used to describe embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Embodiments of the present disclosure provide a semiconductor structure, and a method of making the same, in which improved backside metal contacts are formed for connecting to power rails located on a backside of the wafer. The backside metal contacts and backside power rails are formed by backside processes which are performed after completing BEOL processes and flipping the wafer over. Specifically, a sigma etch process is conducted to achieve backside contacts with a first tapering angle that is different from a second tapering angle of the backside power rails. The sigma etch process and the use of a placeholder material allows simultaneously depositing conductive metals for forming backside contacts and backside power rails in fewer processing steps, thereby simplifying the manufacturing process and increasing a contact area between backside metal contacts and backside power rails for improved device performance and reliability.

An embodiment by which the semiconductor structure with improved backside metal contact can be formed is described in detailed below by referring to the accompanying drawings in FIGS. 1-21C.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X', line Y1-Y1' and line Y2-Y2'. As depicted in the figure, line X-X' represents a cut along a nanosheet fin structure or nanosheet fin region 20 of the semiconductor structure 100, line Y1-Y1' represents a cut across source/drain regions in NFET regions 12 and PFET regions 16 of the semiconductor structure 100, and line Y2-Y2' represents a cut along a gate structure or gate region 24 of the semiconductor structure 100.

In this embodiment, the cross-sectional view taken along line Y1-Y1' may further include a view of NFET regions 12 and/or PFET regions 16 and an area (N-P boundary) 14 between NFET and PFET regions 12, 16. Further, the cross-sectional view taken along line Y1-Y1' may include a view of a shared buried power rail (BPR) region 22.

Figure 2:
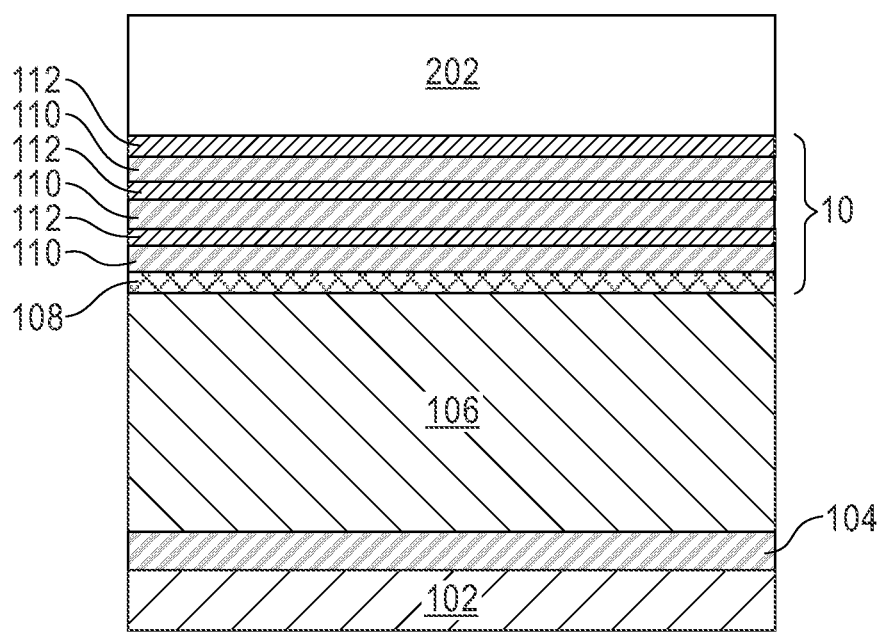
FIG. 2 is a cross-sectional view of the semiconductor structure taken along Y1-Y1', as shown in FIG. 1, depicting forming a nanosheet stack, according to an embodiment of the present disclosure.

Referring now to FIG. 2, a cross-sectional view of the semiconductor structure 100 is shown after forming a nanosheet stack 10, according to an embodiment of the present disclosure. In this embodiment, FIG. 2 is a cross-sectional view of the semiconductor structure 100 taken along Y1-Y' as depicted in FIG. 1.

In the depicted example, the semiconductor structure 100 includes a substrate 102, a first sacrificial layer 104 located above the substrate 102, and a first semiconductor layer 106 disposed above the first sacrificial layer 104. According to an embodiment, the first sacrificial layer 104 and the first semiconductor layer 106 are vertically stacked one on top of another in a direction perpendicular to the substrate 102, as illustrated in the figure.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

With continued reference to FIG. 2, according to an embodiment, the first sacrificial layer 104, can be formed on the substrate 102 using an epitaxial growth process. For instance, in the described embodiment, the first sacrificial layer 104 is formed by epitaxially growing a layer of SiGe with a germanium concentration varying from approximately 15 atomic percent to approximately 35 atomic percent. In a preferred embodiment, the first sacrificial layer 104 is made of epitaxially grown SiGe with a germanium concentration of approximately 30 atomic percent. In one or more embodiments, the first sacrificial layer 104 may act as an etch stop layer during subsequent substrate removal.

Similarly, the first semiconductor layer 106 is formed by epitaxially growing a Si layer to a thickness varying from approximately 30 nm to approximately 150 nm, although other thicknesses are within the contemplated scope of the invention. In some embodiments, the first sacrificial layer 104 may include $SiO_2$. In such embodiments, the combined structure formed by the substrate 102, the first sacrificial layer 104, and the first semiconductor layer 106 can be an SOI wafer, with the first sacrificial layer 104 being the buried oxide (BOX) including a thickness ranging from approximately 20 nm to approximately 100 nm, and ranges therebetween.

In general, the first sacrificial layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultrahigh vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first sacrificial layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

In the depicted embodiment, an alternating sequence of layers of sacrificial semiconductor material and layers of semiconductor channel material vertically stacked one on top of another in a direction perpendicular to the substrate 102 forms the nanosheet stack 10, as illustrated in the figure. Specifically, the alternating sequence includes a nanosheet stack sacrificial layer 108 above the first semiconductor layer 106, a second sacrificial semiconductor layer 110 above the nanosheet stack sacrificial layer 108, and a semiconductor channel layer 112 above the second sacrificial semiconductor layer 110. In the example depicted in the figure, alternating second sacrificial semiconductor layers 110 and semiconductor channel layers 112 are formed in a (nanosheet) stack 10 above the nanosheet stack sacrificial layer 108. The term sacrificial, as used herein, means a layer or other structure, that is (or a part thereof is) removed before completion of the final device.

For instance, in the example being described, portions of the second sacrificial semiconductor layers 110 will be removed from the stack in the channel region of the device to permit the semiconductor channel layers 112 to be released from the nanosheet stack 10. It is notable that while in the present example the second sacrificial semiconductor layers 110 and the semiconductor channel layers 112 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

With continued reference to FIG. 2, a first (sacrificial) layer in the stack, i.e., the nanosheet stack sacrificial layer 108, is formed on the first semiconductor layer 106 using an epitaxial growth process. For instance, in the described embodiment, the nanosheet stack sacrificial layer 108 is formed by epitaxially growing a layer of SiGe with a higher germanium concentration varying between approximately 45 atomic percent to approximately 70 atomic percent. In a preferred embodiment, the nanosheet stack sacrificial layer 108 includes a layer of SiGe with a germanium concentration of approximately 55 atomic percent. The higher concentration of germanium atoms allows the nanosheet stack sacrificial layer 108 to be removed selectively to the remaining alternating layers of the nanosheet stack 10, as will be described in detail below. By way of example only, the nanosheet stack sacrificial layer 108 may be formed having a thickness varying from approximately 5 nm to approximately 20 nm, although thicknesses greater than 20 nm and less than 5 nm may also be used.

In general, layers in the nanosheet stack 10 (e.g., SiGe and Si layers) can be formed by epitaxial growth by using the first semiconductor layer 106 as the seed layer. For instance, the second sacrificial semiconductor layers 110 are formed by epitaxially growing a layer of SiGc. In this embodiment, the germanium concentration of the second sacrificial semiconductor layers 110 may vary from approximately 15 atomic percent to approximately 35 atomic percent. In a preferred embodiment, each of the second sacrificial semiconductor layers 110 includes a layer of SiGe with a germanium concentration of approximately 30 atomic percent.

To continue building the nanosheet stack 10, the semiconductor channel layers 112 are formed by epitaxially growing a Si layer. As depicted in the figure, the second sacrificial semiconductor layers 110 and the semiconductor channel layers 112 have a substantially similar or identical thickness. The nanosheet stack 10 is grown by forming (SiGe) sacrificial semiconductor layers 110 and (Si) semiconductor channel layers 112 in an alternating manner onto the nanosheet stack sacrificial layer 108. Accordingly, each of the second sacrificial semiconductor layers 110 and the semiconductor channel layers 112 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 112 in the nanosheet stack 10 will be used to form the channel layers of the device. Consequently, the dimensions of the semiconductor channel layers 112 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "PFET") or a negative channel Field Effect Transistor (hereinafter "NFET") device.

In the depicted embodiment, the semiconductor structure 100 further includes a hardmask layer 202 formed over the nanosheet stack 10 by depositing a hard mask material (e.g., silicon nitride) using, for example, chemical vapor deposition (CVD), plasma enhanced CVD (PECVD) or any suitable technique for dielectric deposition. By way of example only, the hardmask layer 202 may be formed having a thickness varying from approximately 20 nm to approximately 200 nm, although thicknesses greater than 200 nm and less than 20 nm may also be used.

Figure 3:
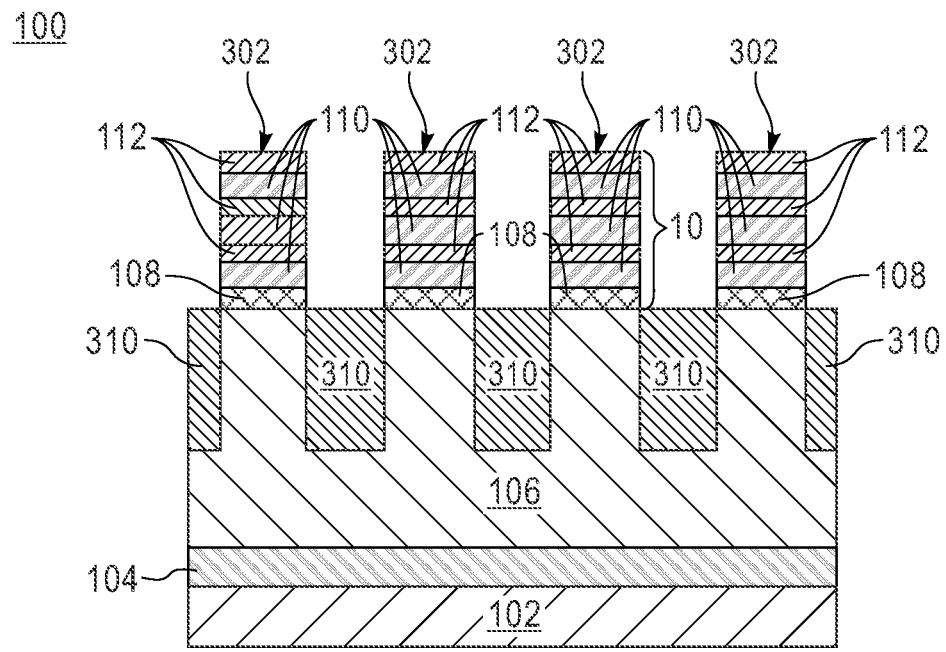
FIG. 3 is a cross-sectional view of the semiconductor structure taken along line Y1-Y1', as shown in FIG. 1, depicting patterning the nanosheet stack and forming nanosheet fins, according to an embodiment of the present disclosure.

Referring now to FIG. 3, a cross-sectional view of the semiconductor structure 100 is shown after patterning the nanosheet stack 10 to form a plurality of nanosheet fins (hereinafter "nanosheet fins"), according to an embodiment of the present disclosure. In this embodiment, FIG. 3 is a cross-sectional view of the semiconductor structure 100 taken along Y1-Y1' as depicted in FIG. 1.

After depositing the hardmask layer 202 depicted in FIG. 2, a photolithographic patterning is then conducted on the deposited hardmask layer 202 to form a plurality of individual fin hardmasks. According to an exemplary embodiment, reactive ion etching (RIE) can be used to etch through the nanosheet stack 10 to form nanosheet fins 302. The etching process may continue until upper portions of the first semiconductor layer 106 located between adjacent nanosheet fins 302 are removed forming a plurality of trenches (not shown). The plurality of trenches (not shown) formed during the photolithographic patterning process are subsequently filled with an insulating material to form shallow trench isolation (STI) regions 310, as depicted in the figure.

The process of forming the STI regions 310 is standard and well-known in the art, it typically involves depositing the insulating material to substantially fill the plurality of trenches (not shown) created after removing the portions of the first semiconductor layer 106 located between adjacent nanosheet fins 302. According to an embodiment, the STI regions 310 electrically isolate the nanosheet fins 302. The STI regions 310 may be formed by, for example, CVD of a dielectric material. Non-limiting examples of dielectric materials to form the STI regions 310 include silicon oxide, silicon nitride, hydrogenated silicon carbon oxide, silicon based low-k dielectrics, flowable oxides, porous dielectrics, or organic dielectrics including porous organic dielectrics. After forming the STI regions 310, the hardmask layer 202 (FIG. 2) can be removed from the semiconductor structure 100 using any suitable etching technique.

Figure 4A:
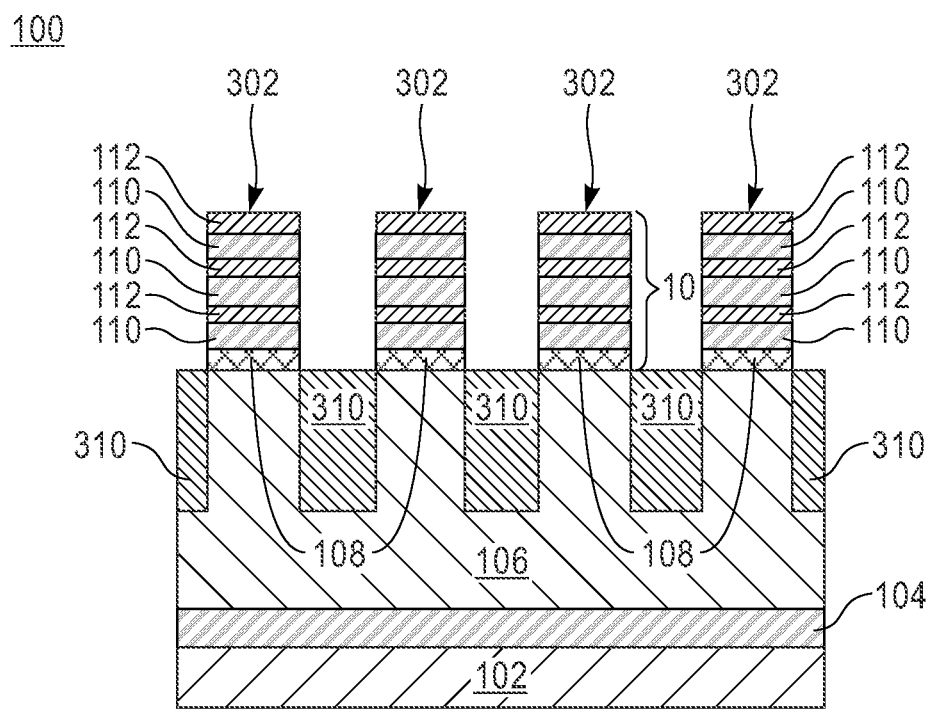
FIG. 4A is a cross-sectional view of the semiconductor structure taken along Y1-Y1', as shown in FIG. 1, depicting depositing a dummy gate and a sacrificial hardmask, according to an embodiment of the present disclosure.

Referring now to FIGS. 4A-4C, cross-sectional views of the semiconductor structure 100 are shown after depositing a dummy gate 410 and a sacrificial hardmask 420, according to an embodiment of the present disclosure. In this embodiment, FIG. 4A is a cross-sectional view of the semiconductor structure 100 taken along line Y1-Y1', as depicted in FIG. 1; FIG. 4B is a cross-sectional view of the semiconductor structure 100 taken along line Y2-Y2', as depicted in FIG. 1; and FIG. 4C is a cross-sectional view of the semiconductor structure 100 taken along line X-X', as depicted in FIG. 1.

The dummy gate 410 and sacrificial hardmask 420 form a sacrificial gate structure for the semiconductor structure 100. The process of forming the dummy gate 410 and sacrificial hardmask 420 is typical and well-known in the art. In one or more embodiments, the dummy gate 410 is formed from amorphous silicon (a-Si), and the sacrificial hardmask 420 is formed from silicon nitride (SiN), silicon oxide, an oxide/nitride stack, or similar materials and configurations.

After depositing the dummy gate 410 and sacrificial hardmask 420 on the semiconductor structure 100, the dummy gate 410 and sacrificial hardmask 420 are patterned as depicted in the figures. As known by those skilled in the art, the process of patterning the dummy gate 410 typically involves exposing a pattern on a photoresist layer (not shown) and transferring the pattern to the sacrificial hardmask 420 and dummy gate 410 using known lithography and RIE processing, as shown in FIG. 4C. The dummy gate 410 is formed and patterned over a topmost semiconductor channel layer 112 and along sidewalls of the nanosheet fins 302. As depicted in FIG. 4C, patterning of the dummy gate 410 exposes portions of the topmost semiconductor channel layer 112 located between sacrificial gate structures. As mentioned above, the cross-sectional view of FIG. 4A is taken along line Y1-Y1' as depicted in FIG. 1, thus FIG. 4A does not show the sacrificial gate structure formed by the dummy gate 410 and sacrificial hardmask 420.

Figure 5A:
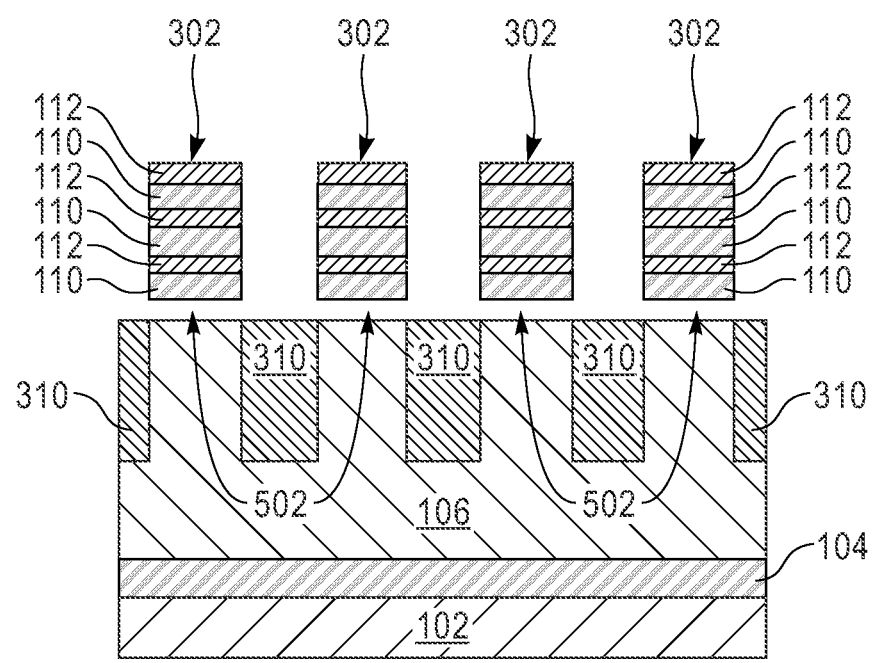
FIG. 5A is a cross-sectional view of the semiconductor structure taken along Y1-Y1', as shown in FIG. 1, depicting removing a nanosheet stack sacrificial layer, according to an embodiment of the present disclosure.

Referring now to FIGS. 5A-5C, cross-sectional views of the semiconductor structure 100 are shown after removing the nanosheet stack sacrificial layer 108 (FIGS. 4A-4C), according to an embodiment of the present disclosure. In this embodiment, FIG. 4A is a cross-sectional view of the semiconductor structure 100 taken along line Y1-Y1', as depicted in FIG. 1; FIG. 5B is a cross-sectional view of the semiconductor structure 100 taken along line Y2-Y2', as depicted in FIG. 1; and FIG. 5C is a cross-sectional view of the semiconductor structure 100 taken along line X-X', as depicted in FIG. 1.

As shown in the depicted embodiment, removal of the nanosheet stack sacrificial layer 108 (FIGS. 4A-4C) creates first openings 502 in areas of the semiconductor structure 100 from which the nanosheet stack sacrificial layer 108 (FIGS. 4A-4C) was removed. According to an embodiment, the nanosheet stack sacrificial layer 108 is removed selective to the first semiconductor layer 106, the second sacrificial semiconductor layers 110, the semiconductor channel layers 112, the dummy gate 410 and the sacrificial hardmask 420. For example, a highly selective dry etch process can be used to selectively remove the nanosheet stack sacrificial layer 108 (FIGS. 4A-4C).

Figure 6A:
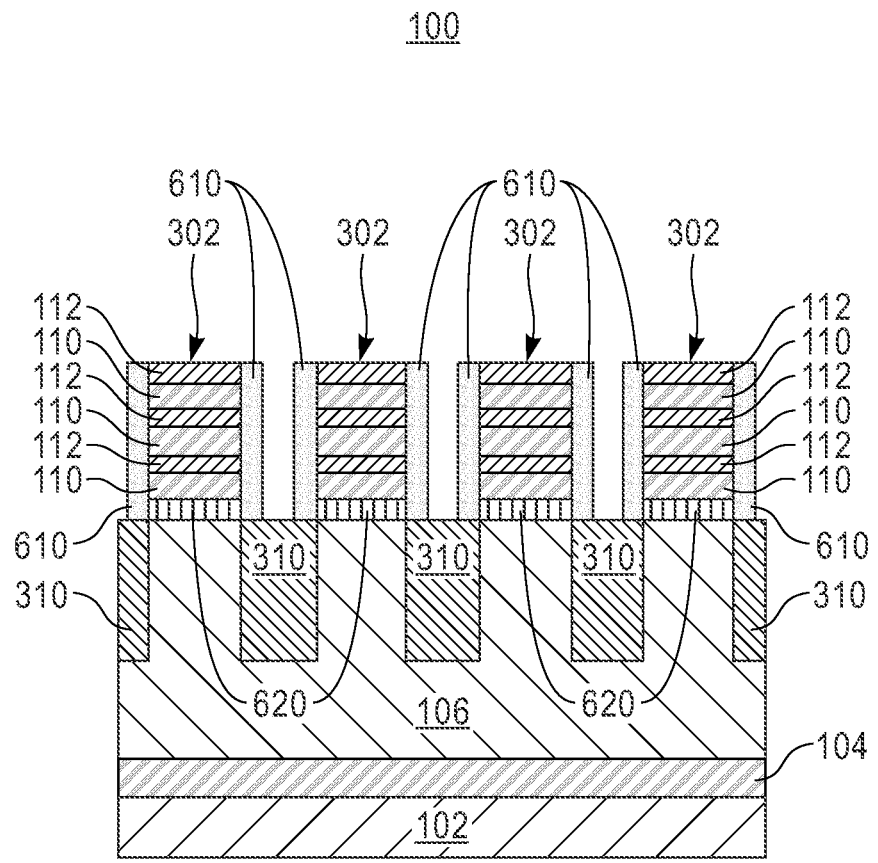
FIG. 6A is a cross-sectional view of the semiconductor structure taken along Y1-Y1', as shown in FIG. 1, depicting forming a sidewall spacer, according to an embodiment of the present disclosure.

Referring now to FIGS. 6A-6C, cross-sectional views of the semiconductor structure 100 are shown after forming a sidewall spacer 610, according to an embodiment of the present disclosure. In this embodiment, FIG. 6A is a cross-sectional view of the semiconductor structure 100 taken along line Y1-Y1', as depicted in FIG. 1; FIG. 6B is a cross-sectional view of the semiconductor structure 100 taken along line Y2-Y2', as depicted in FIG. 1; and FIG. 6C is a cross-sectional view of the semiconductor structure 100 taken along line X-X', as depicted in FIG. 1.

In this embodiment, a spacer material is deposited on the semiconductor structure 100. As depicted in FIG. 6C, the spacer material deposits along sidewalls of the dummy gate 410 and sacrificial hardmask 420 to form the sidewall spacer 610. The spacer material forming the sidewall spacer 610 substantially fills the first openings 502 shown in FIGS. 5A-5C. The sidewall spacer 610 can be formed using a spacer pull down formation process. The sidewall spacer 610 can also be formed using a sidewall image transfer (SIT) spacer formation process, which includes spacer material deposition followed by directional RIE of the deposited spacer material. In one or more embodiments, the spacer material deposited between a bottom surface of the nanosheet fins 302 and the substrate 102 can be referred to as a bottom dielectric isolation layer 620. In some embodiments, the bottom dielectric isolation layer 620 and the sidewall spacer 610 may be composed of different materials.

Non-limiting examples of various spacer materials for forming the sidewall spacer 610 and the bottom dielectric isolation layer 620 may include conventional low-k materials such as $SiO_2$, SiOC, SiOCN, or SiBCN. Typically, a thickness of the sidewall spacer 610 may vary from approximately 5 nm to approximately 20 nm, and ranges therebetween.

Figure 7A:
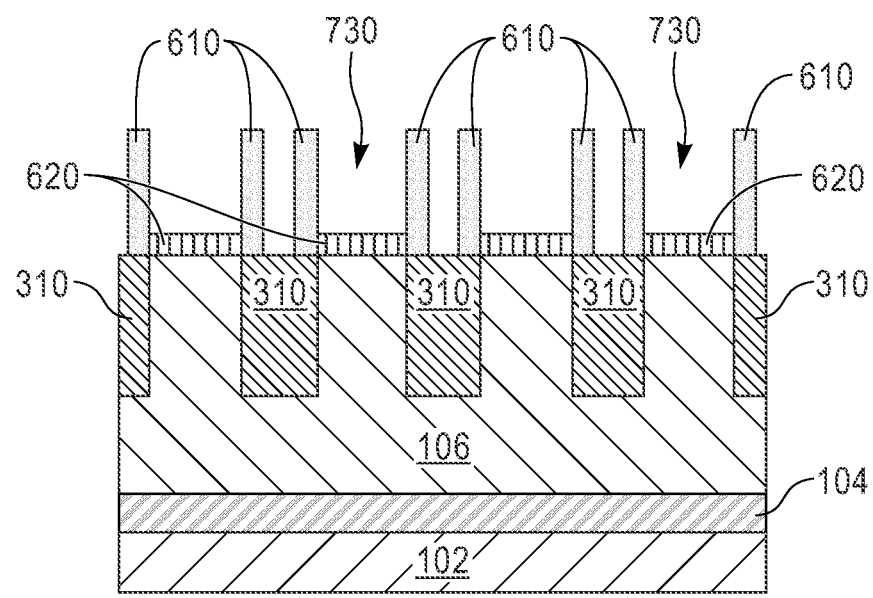
FIG. 7A is a cross-sectional view of the semiconductor structure taken along Y1-Y1', as shown in FIG. 1, depicting recessing nanosheet fins and forming inner spacers, according to an embodiment of the present disclosure.
Figure 7C:
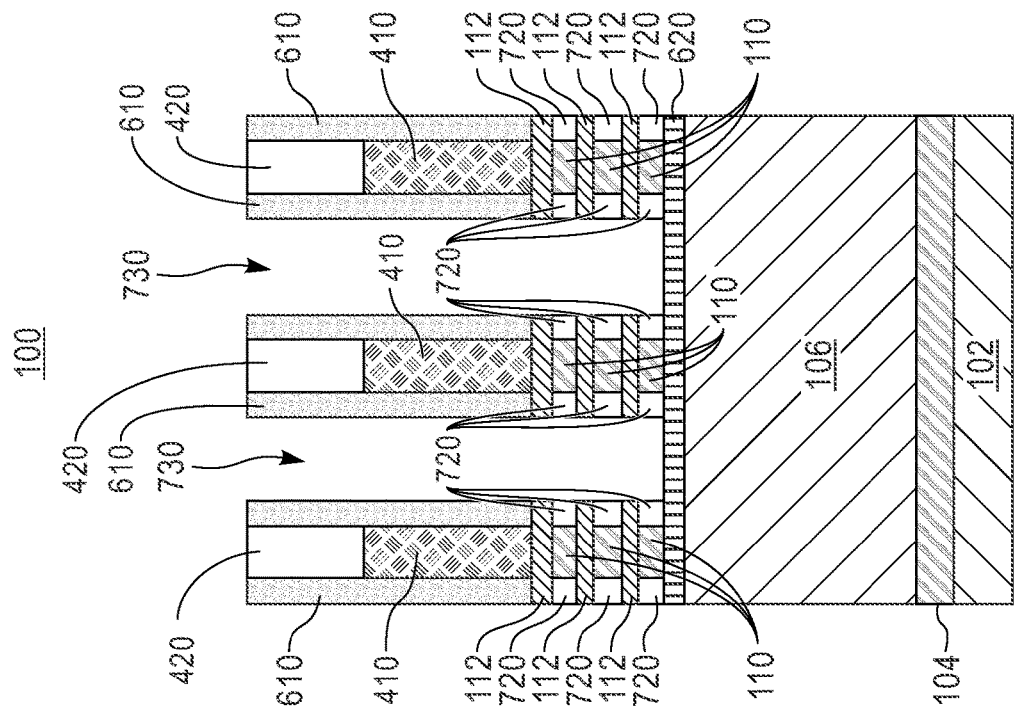
FIG. 7C is a cross-sectional view of the semiconductor structure taken along line X-X', according to an embodiment of the present disclosure.
Figure 7B:
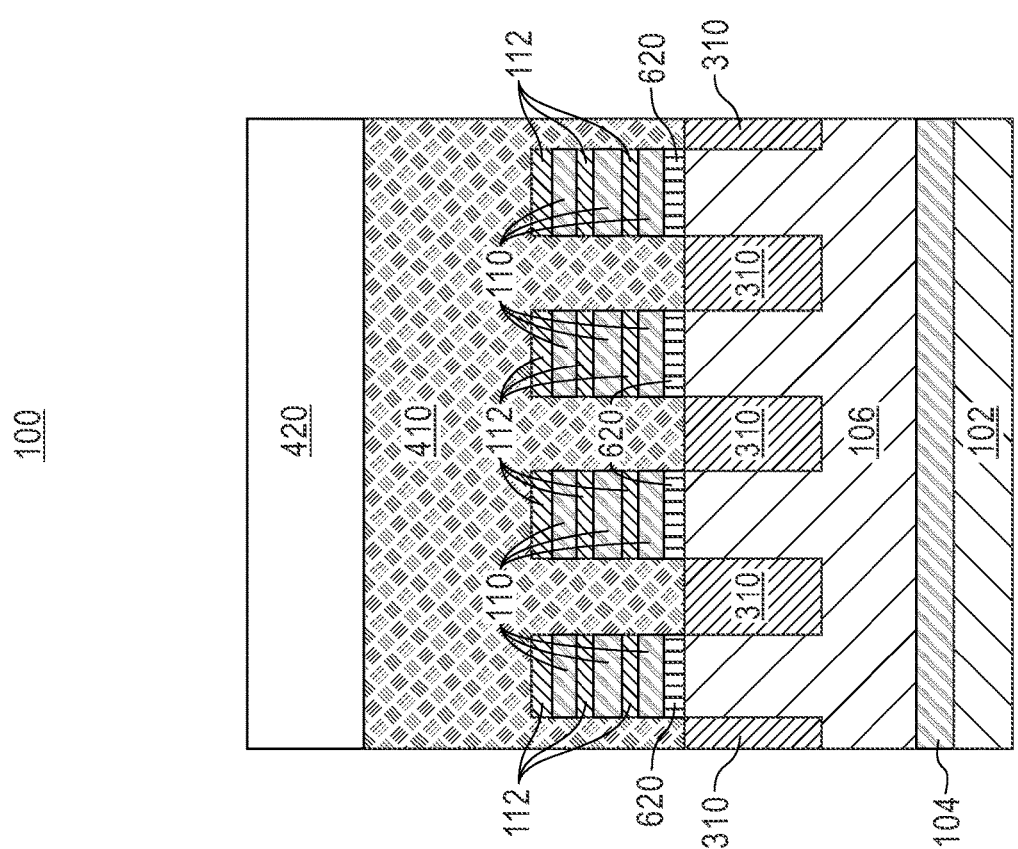
FIG. 7B is a cross-sectional view of the semiconductor structure taken along line Y2-Y2', as shown in FIG. 1, according to an embodiment of the present disclosure.

Referring now to FIGS. 7A-7C, cross-sectional views of the semiconductor structure 100 are shown after recessing nanosheet fins 302 and forming inner spacers 720, according to an embodiment of the present disclosure. In this embodiment, FIG. 7A is a cross-sectional view of the semiconductor structure 100 taken along line Y1-Y1', as depicted in FIG. 1; FIG. 7B is a cross-sectional view of the semiconductor structure 100 taken along line Y2-Y2', as depicted in FIG. 1; and FIG. 7C is a cross-sectional view of the semiconductor structure 100 taken along line X-X', as depicted in FIG. 1.

As known by those skilled in the art, the sidewall spacer 610 can be used as a mask, to recess portions of the nanosheet fins 302 not covered by the sidewall spacer 610 and dummy gate 410, as illustrated in FIG. 7C. For example, a RIE process can be used to recess the portions of the nanosheet fins 302 that are not under the sidewall spacer 610 and dummy gate 410. According to an embodiment, the nanosheet fins 302 can be recessed until reaching a top portion of the bottom dielectric isolation layer 620. As depicted in FIGS. 7A and 7C, recessing of the nanosheet fins 302 form second openings (or source/drain recesses) 730 in the semiconductor structure 100.

With continued reference to FIGS. 7A-7C, outer portions of each of the second sacrificial semiconductor layers 110 are selectively recessed using, for example, a selective etch process such as a hydrogen chloride (HCL) gas etch. Preferably, the selected etch process for recessing the second sacrificial semiconductor layers 110 is capable of etching silicon germanium without attacking silicon. The inner spacers 720 may be formed within an indented cavity (not shown) formed after etching the second sacrificial semiconductor layers 110. The inner spacers 720 can be formed, for example, by conformal deposition of an inner spacer dielectric material that pinches off the indented cavity (not shown) formed after recessing the second sacrificial semiconductor layers 110. The inner spacers 720 may be formed using any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100.

As depicted in FIG. 7C, outer sidewalls of the inner spacers 720 are vertically aligned with the semiconductor channel layers 112, and thus with upper portions of the sidewall spacer 610 located on opposing sidewalls of the dummy gate 410.

Figure 8A:
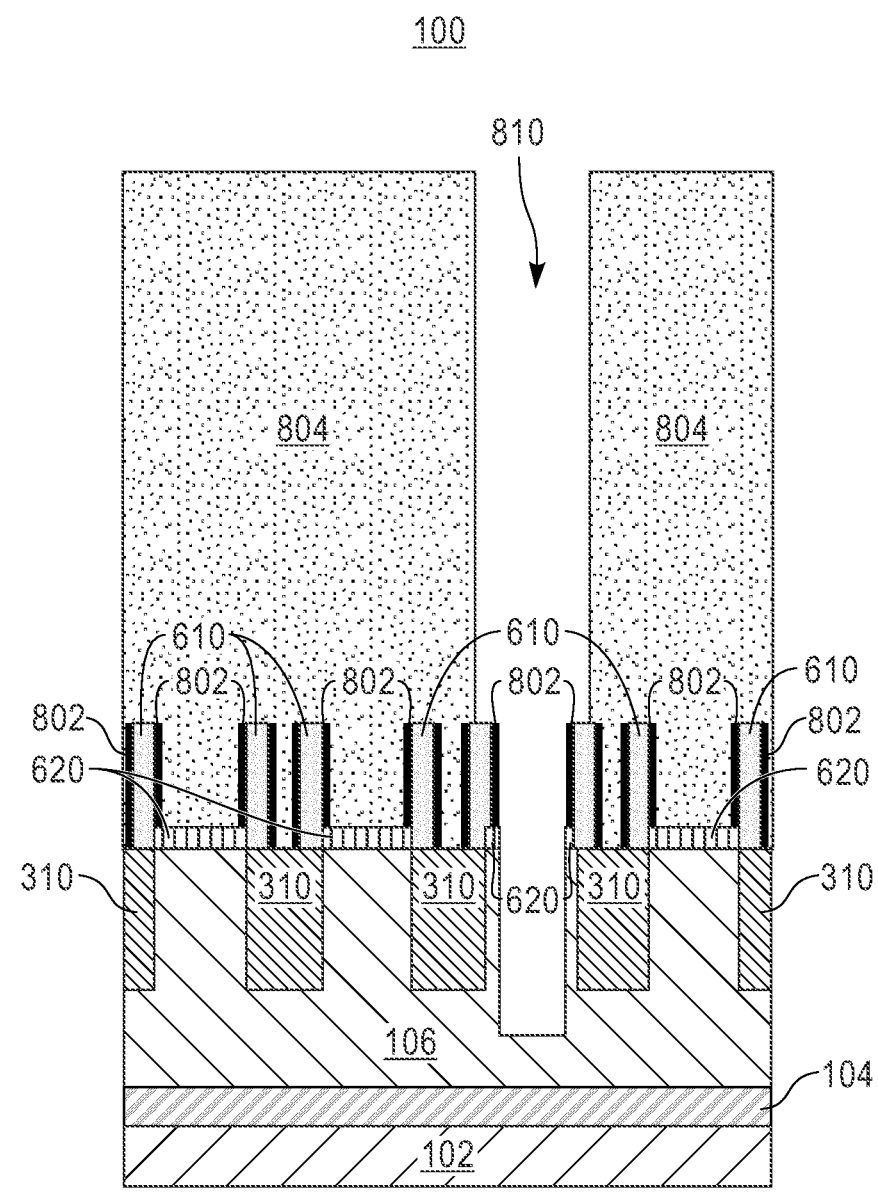
FIG. 8A is a cross-sectional view of the semiconductor structure taken along Y1-Y1', as shown in FIG. 1, depicting forming a spacer protective layer and conducting backside contact patterning, according to an embodiment of the present disclosure.

Referring now to FIGS. 8A-8C, cross-sectional views of the semiconductor structure 100 are shown after forming a nanosheet protective layer 802 and conducting backside contact patterning, according to an embodiment of the present disclosure. In this embodiment, FIG. 8A is a cross-sectional view of the semiconductor structure 100 taken along line Y1-Y1', as depicted in FIG. 1; FIG. 8B is a cross-sectional view of the semiconductor structure 100 taken along line Y2-Y2', as depicted in FIG. 1; and FIG. 8C is a cross-sectional view of the semiconductor structure 100 taken along line X-X', as depicted in FIG. 1.

According to an embodiment, the nanosheet protective layer 802 is formed within second openings 730 (FIGS. 6A-6C) on opposite sides of the sidewall spacer 610, as depicted in FIG. 8A and FIG. 8C. In an exemplary embodiment, the nanosheet protective layer 802 may be composed of SiN, TiOx, AlOx, $SiO_2$, SiOCN, SiC, and equivalent materials. An ALD deposition process followed by an anisotropic etching process can be used to form the nanosheet protective layer 802 as configured in FIG. 8A and FIG. 8C. Particularly, the nanosheet protective layer 802 is formed in a way such that only portions of the nanosheet protective layer 802 perpendicular to the substrate 102 remain in the semiconductor structure 100. A thickness of the nanosheet protective layer 802 may vary from approximately 1 nm to approximately 3 nm, and ranges therebetween. The nanosheet protective layer 802 may, as implied by the name, protect the integrity of sidewall spacer 610 and nanosheet fins 302 during subsequent etching process.

After forming the nanosheet protective layer 802, an organic planarization layer (OPL), or simply planarization layer 804 can be deposited on the semiconductor structure 100. The planarization layer 804 can be made of any organic planarizing material that is capable of effectively preventing damage of underlying layers during subsequent etching processes. The planarization layer 804 can include, but is not necessarily limited to, an organic polymer including C, H, and N. In an embodiment, the organic planarizing material can be free of silicon (Si). In another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing materials for forming the planarization layer 804 may include JSR HM8006, JSR HM8014, AZ UM10M2, Shin Etsu ODL 102, or other similar commercially available materials. The planarization layer 804 may be deposited by, for example, spin coating.

With continued reference to FIGS. 8A-8C, a lithography process followed by an etching process is conducted on the semiconductor structure 100 for etching the planarization layer 804 and removing a portion of the first semiconductor layer 106 to form third openings 810, as shown in FIG. 8A and FIG. 8C. In some embodiments, etching the planarization layer 804 can be conducted by, for example, an OPL RIE including a trace point detection. Removal of the portion of the first semiconductor layer 106 can be conducted by the same or a different etching process that is selective to nanosheet protective layer 802, STI regions 310, and bottom dielectric isolation layer 620.

In one or more embodiments, a location of the third openings 810 can be selected based on a desired location of subsequently formed backside metal contacts.

Figure 9A:
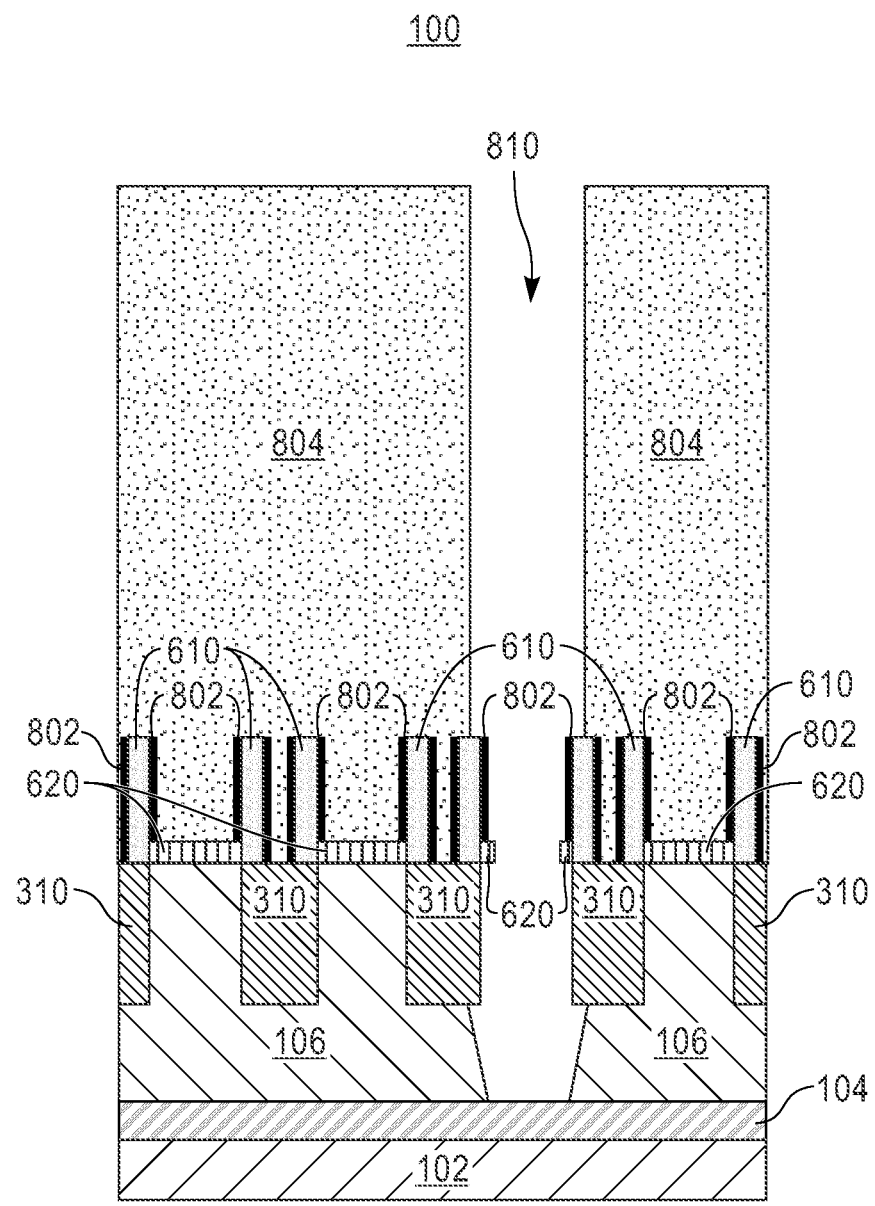
FIG. 9A is a cross-sectional view of the semiconductor structure taken along Y1-Y1', as shown in FIG. 1, depicting sigma etching a first semiconductor layer, according to an embodiment of the present disclosure.
Figure 9C:
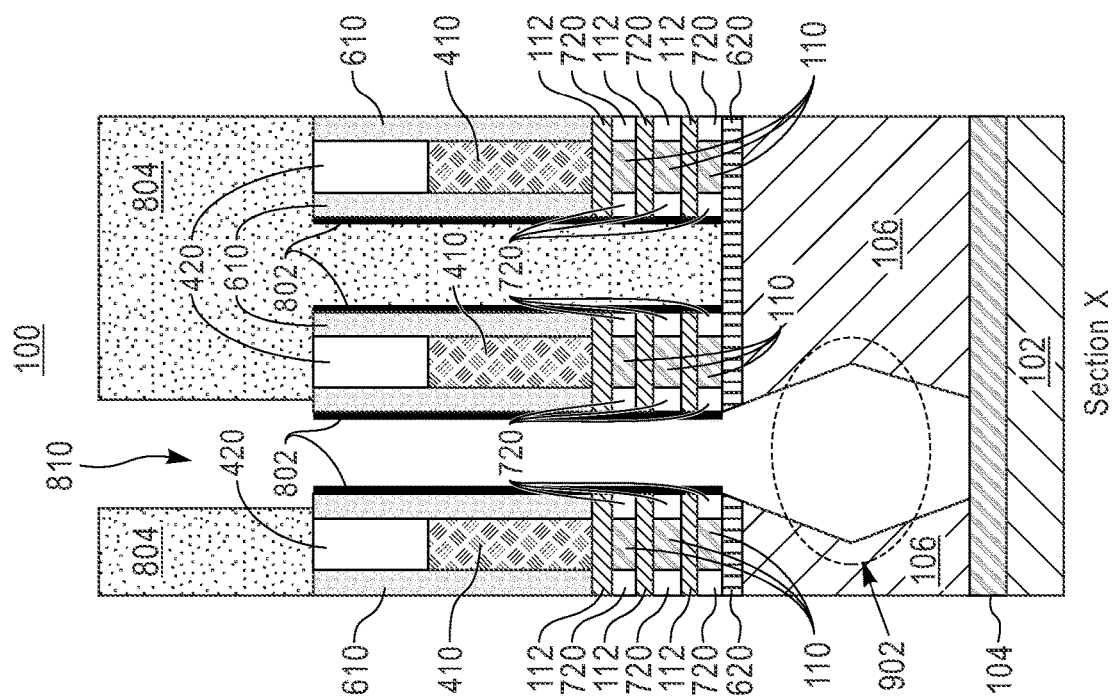
FIG. 9C is a cross-sectional view of the semiconductor structure taken along line X-X', according to an embodiment of the present disclosure.
Figure 9B:
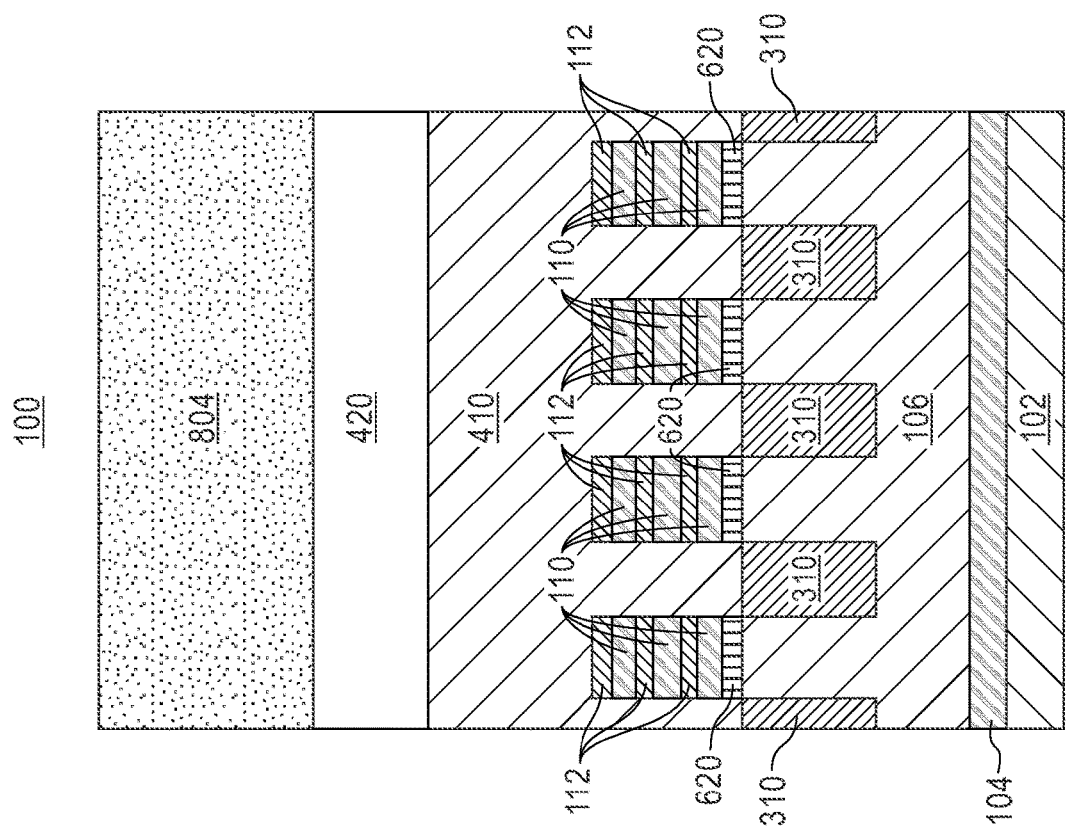
FIG. 9B is a cross-sectional view of the semiconductor structure taken along line Y2-Y2', as shown in FIG. 1, according to an embodiment of the present disclosure.

Referring now to FIGS. 9A-9C, cross-sectional views of the semiconductor structure 100 are shown after sigma etching the first semiconductor layer 106, according to an embodiment of the present disclosure. In this embodiment, FIG. 9A is a cross-sectional view of the semiconductor structure 100 taken along line Y1-Y1', as depicted in FIG. 1; FIG. 9B is a cross-sectional view of the semiconductor structure 100 taken along line Y2-Y2', as depicted in FIG. 1; and FIG. 9C is a cross-sectional view of the semiconductor structure 100 taken along line X-X', as depicted in FIG. 1.

In the depicted embodiment, a sigma etching process is conducted on the first semiconductor layer 106 further increasing a size of the third openings 810 and exposing a top portion of the first sacrificial layer 104. As may be known by those skilled in the art, sigma etching is synonymous with the terms "crystallographic etching" and "anisotropic etching along crystal planes". Sigma etching includes utilizing a chemical etchant. Examples of chemical etchants that can be used for the sigma etch include, but are not limited to, potassium hydroxide, tetraethylammonium hydroxide, or an aqueous solution of ethylene diamine and pyrocatechol.

The sigma etch is a sigma shape producing etch that cleaves a portion of the first semiconductor layer 106. As illustrated in FIG. 9C, a sigma shape 902 is formed within the first semiconductor layer 106 after conducting the sigma etch process.

Figure 10A:
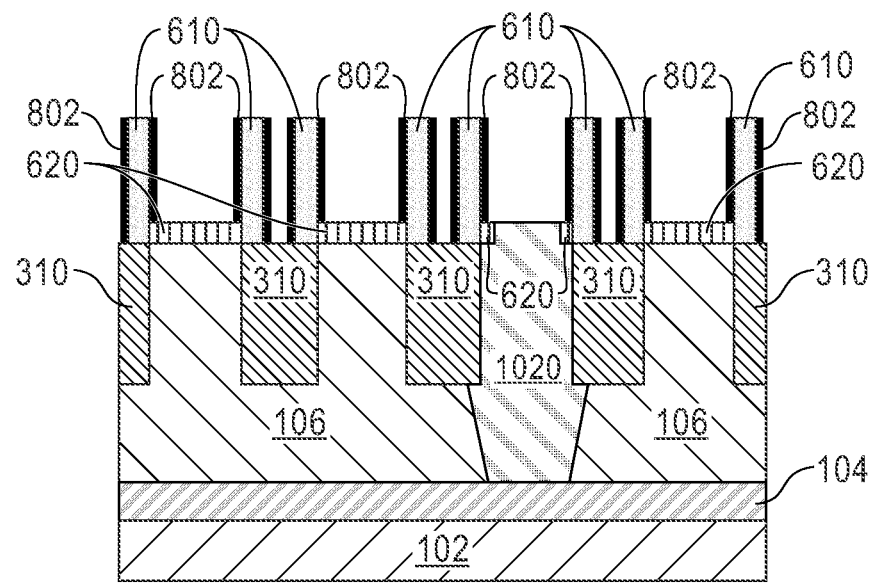
FIG. 10A is a cross-sectional view of the semiconductor structure taken along Y1-Y1', as shown in FIG. 1, depicting forming a placeholder layer and removing a planarization layer, according to an embodiment of the present disclosure.
Figure 10C:
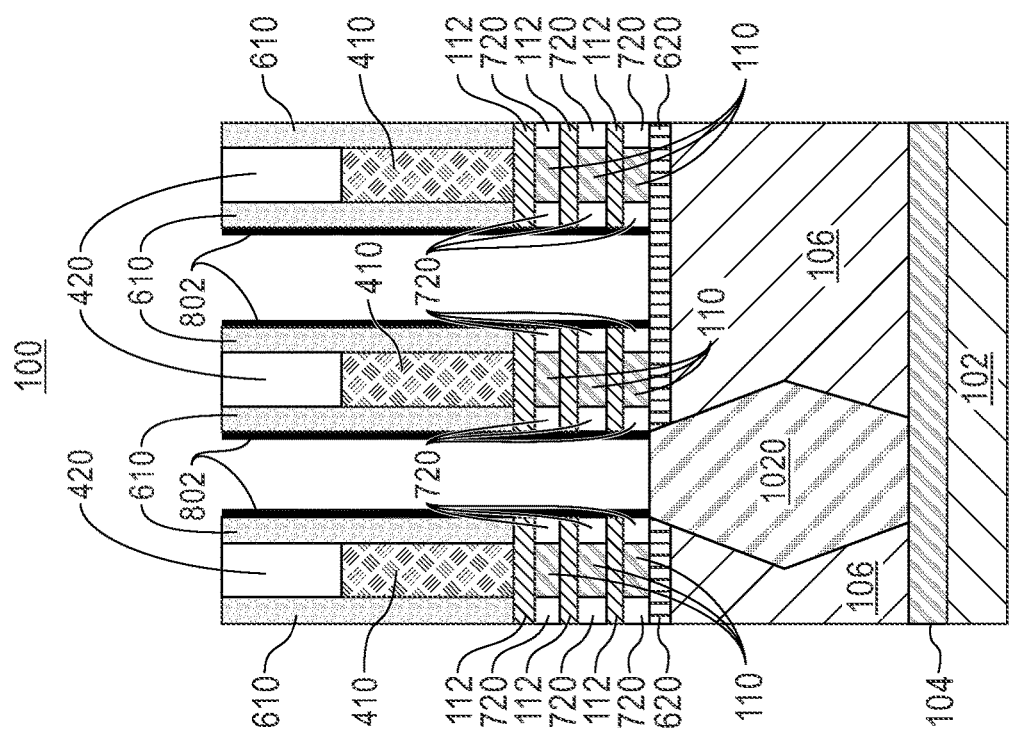
FIG. 10C is a cross-sectional view of the semiconductor structure taken along line X-X', according to an embodiment of the present disclosure.
Figure 10B:
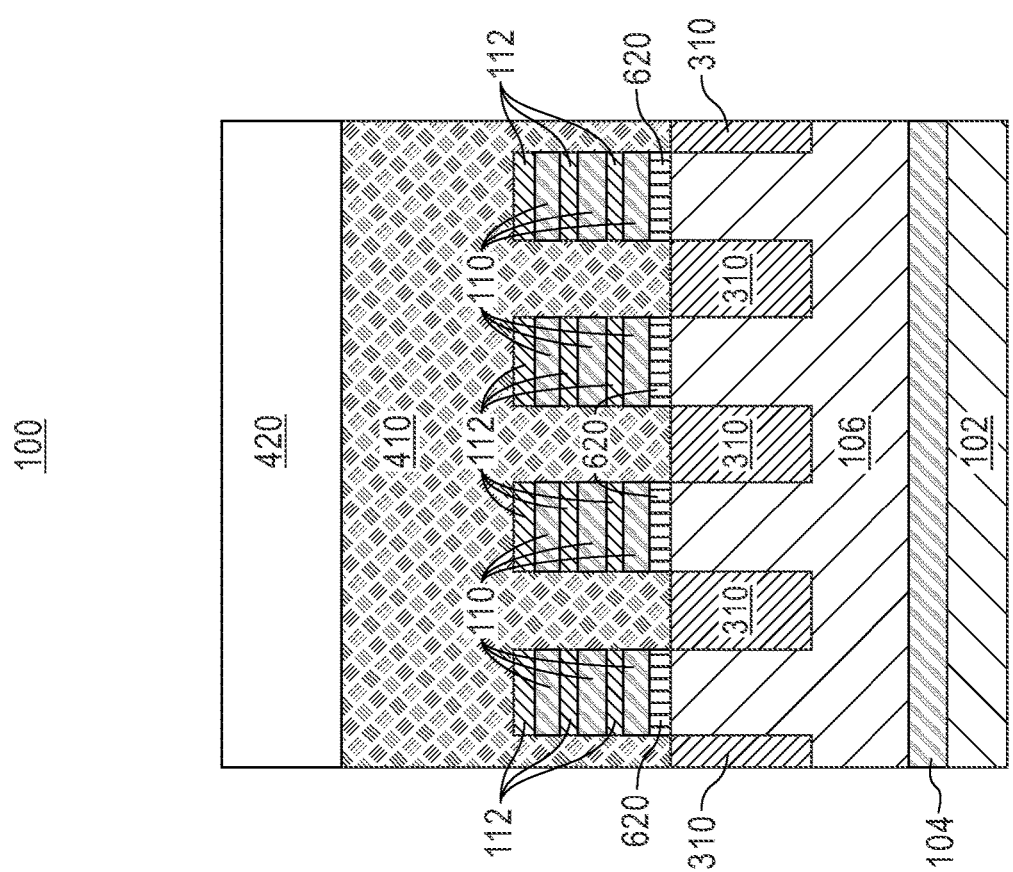
FIG. 10B is a cross-sectional view of the semiconductor structure taken along line Y2-Y2', as shown in FIG. 1, according to an embodiment of the present disclosure.

Referring now to FIGS. 10A-10C, cross-sectional views of the semiconductor structure 100 are shown after forming a placeholder layer 1020 and removing the planarization layer 804 (FIGS. 9A-9C), according to an embodiment of the present disclosure. In this embodiment, FIG. 10A is a cross-sectional view of the semiconductor structure 100 taken along line Y1-Y1', as depicted in FIG. 1; FIG. 10B is a cross-sectional view of the semiconductor structure 100 taken along line Y2-Y2', as depicted in FIG. 1; and FIG. 10C is a cross-sectional view of the semiconductor structure 100 taken along line X-X', as depicted in FIG. 1.

According to an embodiment, a layer of any suitable material for forming the placeholder layer 1020 can be deposited within the third openings 810. In one or more embodiments, the material forming the placeholder layer 1020 may include, for example, SiGe, AlOx, TiOx, and the like. Specifically, the material forming the placeholder layer 1020 substantially fills sigma shaped third openings 810, as illustrated in the figures. In some embodiments, a top surface of the placeholder layer 1020 can be coplanar with a top surface of the bottom dielectric isolation layer 620. The placeholder layer 1020 acts, as implied by the name, as placeholder for subsequently formed backside metal contacts.

After forming the placeholder layer 1020, the planarization layer 804 can be removed from the semiconductor structure 100. Exemplary techniques suitable for removing the planarization layer 804 (FIGS. 9A-9C) from the semiconductor structure 100 may include, but are not limited to, oxygen plasma, nitrogen plasma, hydrogen plasma or other carbon strip or ashing process, which causes minimal or no damage to the underlying layers. Removal of the planarization layer 804 exposes upper surfaces of the bottom dielectric isolation layer 620, STI regions 310, and nanosheet protective layer 802.

Figure 11A:
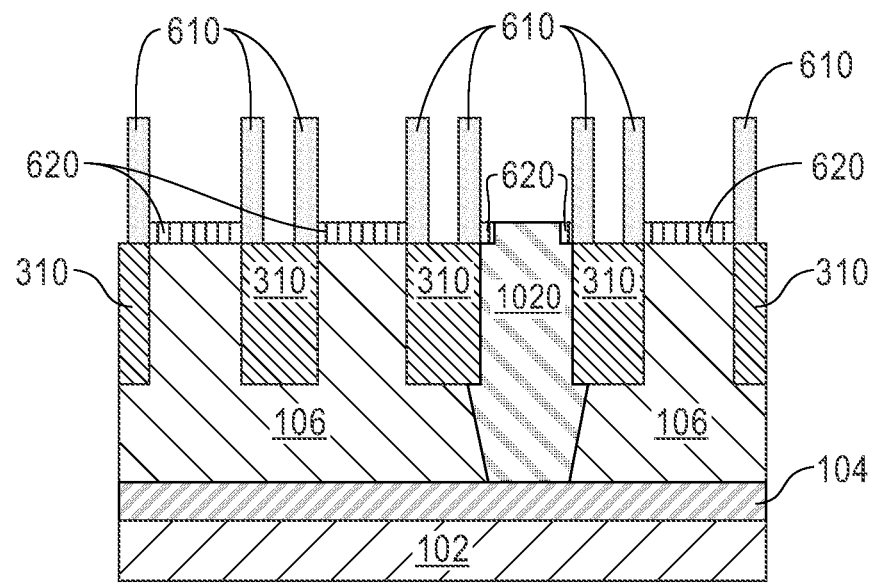
FIG. 11A is a cross-sectional view of the semiconductor structure taken along Y1-Y1', as shown in FIG. 1, depicting removing the spacer protective layer, and forming a back-end-of-line interconnect level and a carrier wafer, according to an embodiment of the present disclosure.
Figure 11C:
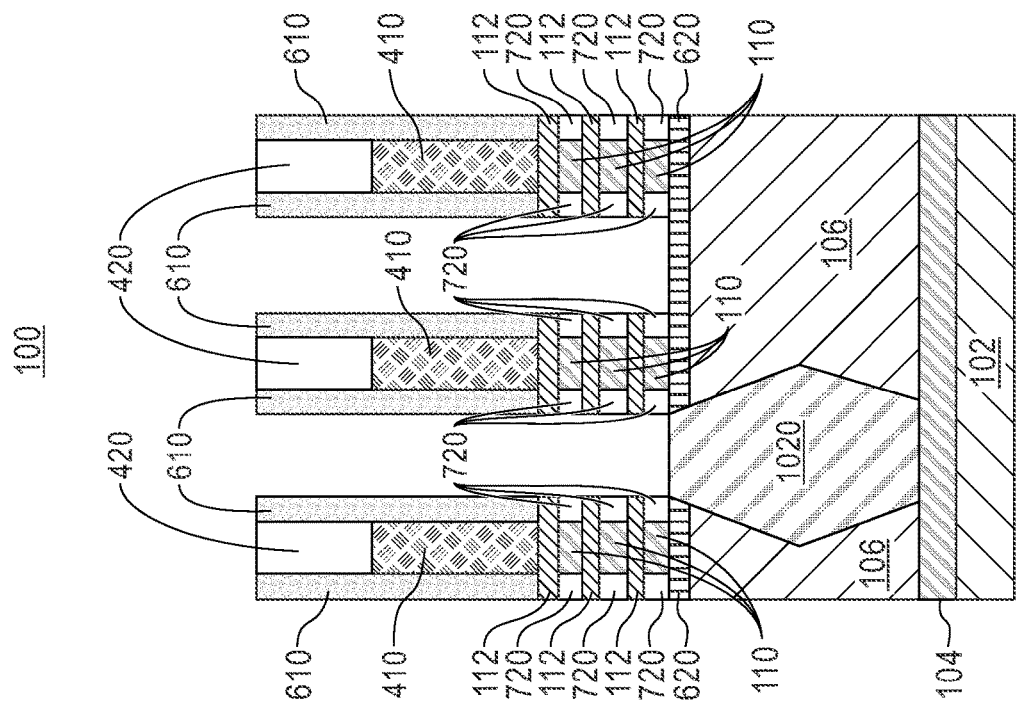
FIG. 11C is a cross-sectional view of the semiconductor structure taken along line X-X', according to an embodiment of the present disclosure.
Figure 11B:
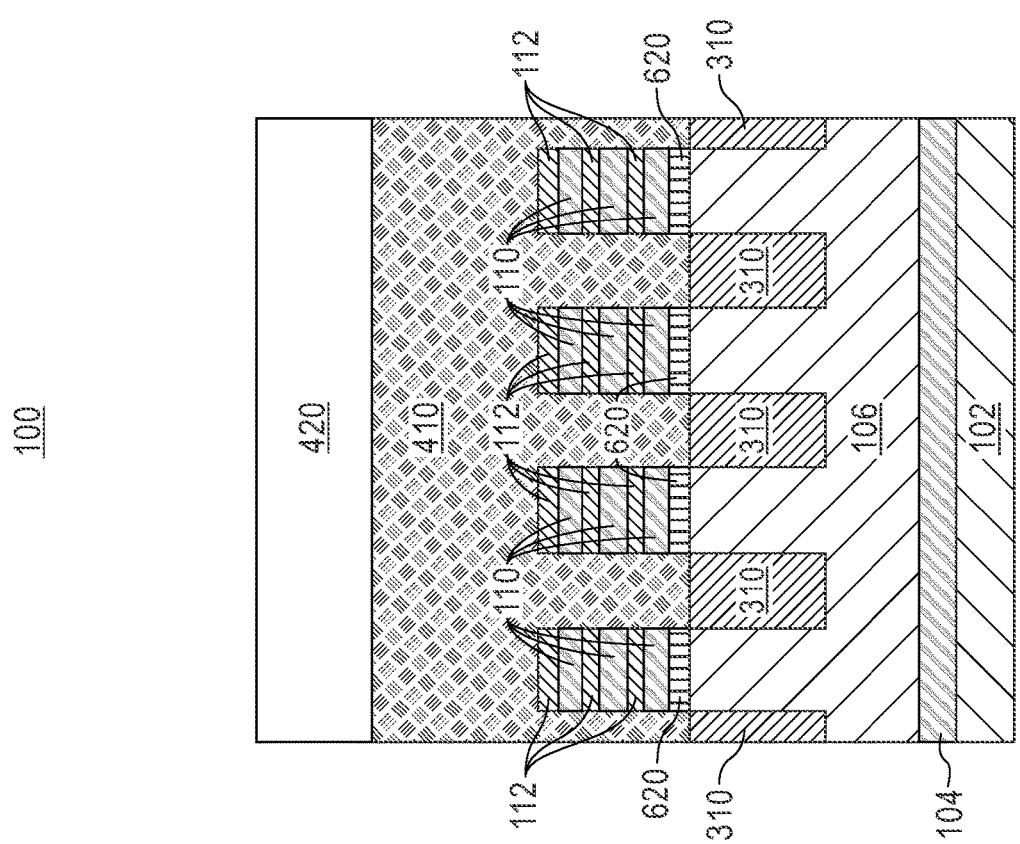
FIG. 11B is a cross-sectional view of the semiconductor structure taken along line Y2-Y2', as shown in FIG. 1, according to an embodiment of the present disclosure.

Referring now to FIGS. 11A-11C, cross-sectional views of the semiconductor structure 100 are shown after removing the nanosheet protective layer 802 (FIGS. 10A-10C), according to an embodiment of the present disclosure. In this embodiment, FIG. 11A is a cross-sectional view of the semiconductor structure 100 taken along line Y1-Y1', as depicted in FIG. 1; FIG. 11B is a cross-sectional view of the semiconductor structure 100 taken along line Y2-Y2', as depicted in FIG. 1; and FIG. 11C is a cross-sectional view of the semiconductor structure 100 taken along line X-X', as depicted in FIG. 1.

Exemplary techniques suitable for removing the nanosheet protective layer 802 (FIGS. 10A-10C) from the semiconductor structure 100 may include, but are not limited to, selective wet or dry etch processes, which may cause minimal or no damage to the underlying layers. Removal of the nanosheet protective layer 802 (FIGS. 10A-10C) exposes upper surfaces of the sidewall spacer 610, bottom dielectric isolation layer 620, STI regions 310, inner spacers 720, and semiconductor channel layers 112, as depicted in the figures.

Figure 12A:
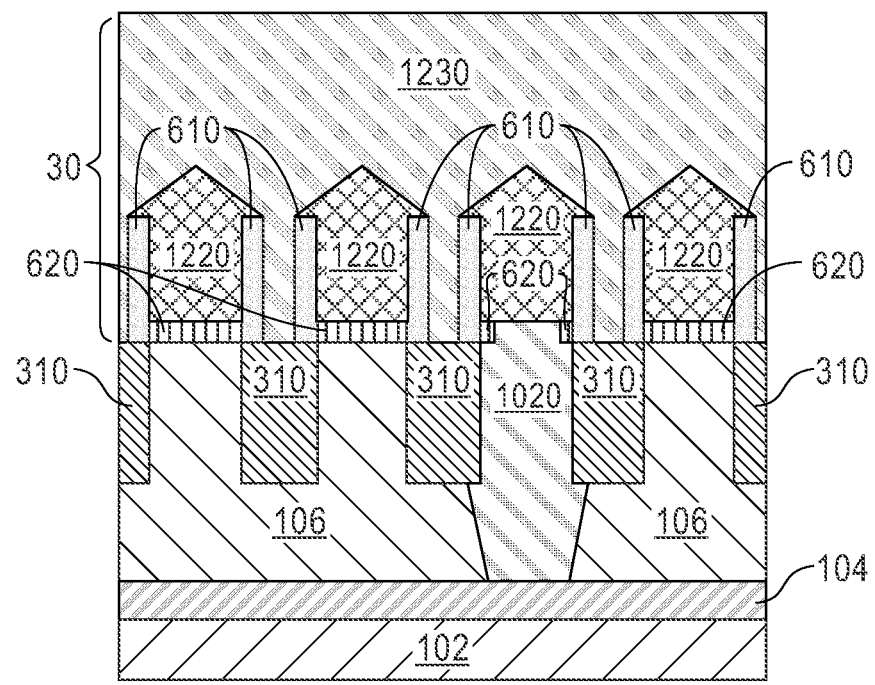
FIG. 12A is a cross-sectional view of the semiconductor structure taken along Y1-Y1', as shown in FIG. 1, depicting completing front-end-of-line (FEOL) processing steps, according to an embodiment of the present disclosure.
Figure 12C:
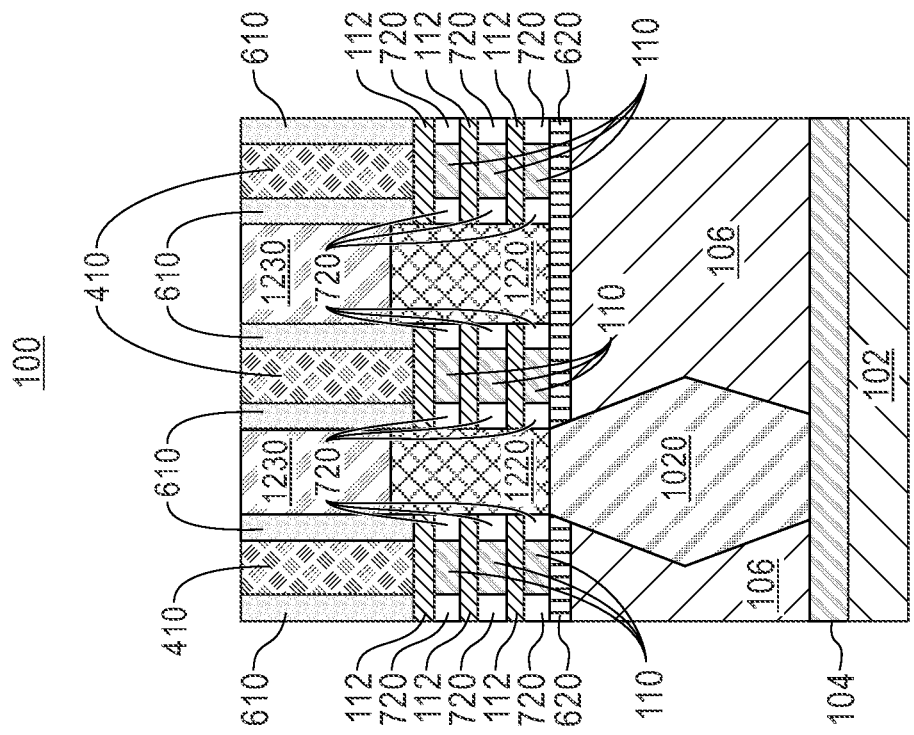
FIG. 12C is a cross-sectional view of the semiconductor structure taken along line X-X', according to an embodiment of the present disclosure.
Figure 12B:
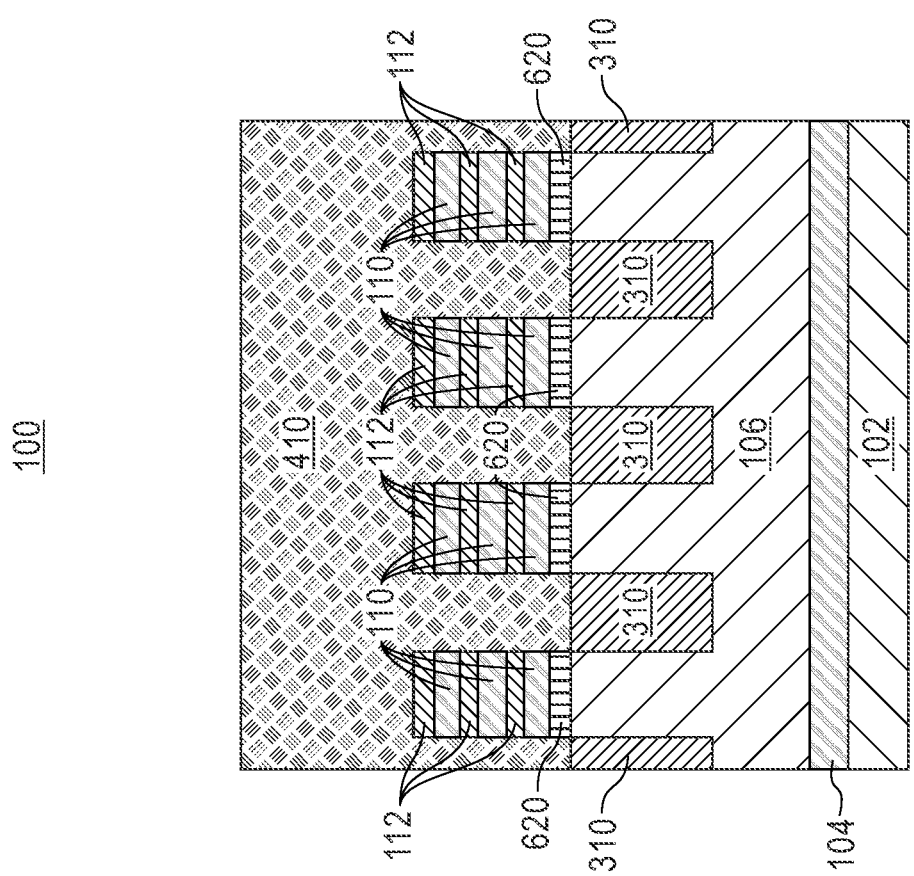
FIG. 12B is a cross-sectional view of the semiconductor structure taken along line Y2-Y2', as shown in FIG. 1, according to an embodiment of the present disclosure.

Referring now to FIGS. 12A-12C, cross-sectional views of the semiconductor structure 100 are shown after completing front-end-of-line (FEOL) processing steps, according to an embodiment of the present disclosure. In this embodiment, FIG. 12A is a cross-sectional view of the semiconductor structure 100 taken along line Y1-Y1', as depicted in FIG. 1; FIG. 12B is a cross-sectional view of the semiconductor structure 100 taken along line Y2-Y2', as depicted in FIG. 1; and FIG. 12C is a cross-sectional view of the semiconductor structure 100 taken along line X-X', as depicted in FIG. 1.

Known semiconductor fabrication operations have been used to form the semiconductor structure 100 as depicted in FIGS. 12A-12C. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Generally, at this step of the manufacturing process, source/drain regions 1220 can be formed in the semiconductor structure 100. As known by those skilled in the art, source/drain regions are formed within NFET and PFET regions 12, 16 (shown in FIG. 1) of the semiconductor structure 100 using methods well-known in the art. For example, the source/drain regions 1220 can be formed using an epitaxial layer growth process on the exposed ends of the semiconductor channel layers 112.

The source/drain regions 1220 can be formed on opposing sides of the nanosheet fins 302 in direct contact with end portions of the semiconductor channel layers 112 and end portions of the inner spacers 720. A top portion of the source/drain regions 1220 may include a diamond shape consequence of the different growth rates during the epitaxial deposition process inherent to each crystallographic orientation plane of the material forming the source/drain regions 1220. In other embodiments, the source/drain regions 1220 may have a shape other than the diamond shape depicted in FIG. 12A.

After forming the source/drain regions 1220, an interlevel dielectric layer 1230 can be formed to fill voids in the semiconductor structure 100. The interlevel dielectric layer 1230 can be formed by, for example, CVD of a dielectric material. Non-limiting examples of dielectric materials to form the interlevel dielectric layer 1230 may include silicon oxide, silicon nitride, hydrogenated silicon carbon oxide, silicon based low-k dielectrics, flowable oxides, porous dielectrics, or organic dielectrics including porous organic dielectrics.

As known by those skilled in the art, after deposition of the interlevel dielectric layer 1230, a planarization process (e.g., CMP) can be conducted on the semiconductor structure 100. This process may expose a top surface of the dummy gate 410 in preparation for a replacement metal gate process, as will be described in detail below.

Figure 13A:
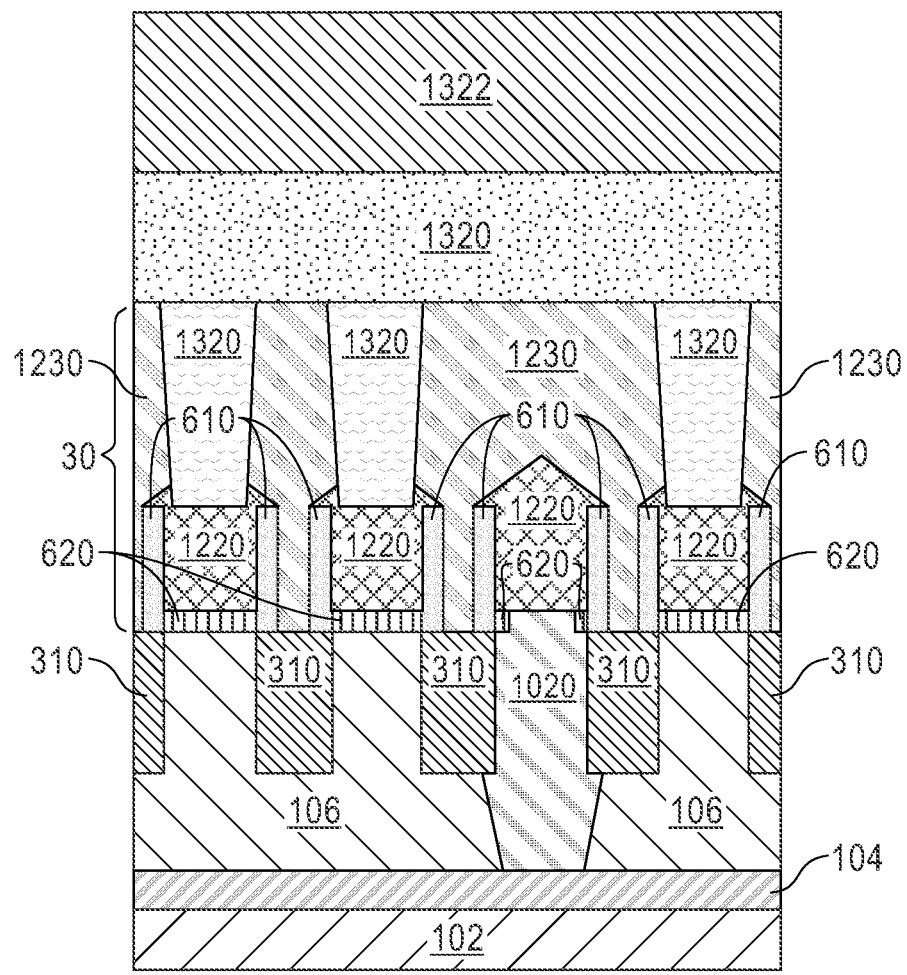
FIG. 13A is a cross-sectional view of the semiconductor structure taken along Y1-Y1', as shown in FIG. 1, depicting conducting a replacement metal gate process, conducting middle-of-line contact patterning and metallization, and forming a back-end-of-line interconnect level and a carrier wafer, according to an embodiment of the present disclosure.

Referring now to FIGS. 13A-13C, cross-sectional views of the semiconductor structure 100 are shown after conducting a replacement metal gate process, conducting middle-of-line (MOL) contact patterning and metallization, and forming a back-end-of-line (BEOL) interconnect level 1320 and a carrier wafer 1322, according to an embodiment of the present disclosure. In this embodiment, FIG. 13A is a cross-sectional view of the semiconductor structure 100 taken along line Y1-Y1', as depicted in FIG. 1; FIG. 13B is a cross-sectional view of the semiconductor structure 100 taken along line Y2-Y2', as depicted in FIG. 1; and FIG. 13C is a cross-sectional view of the semiconductor structure 100 taken along line X-X', as depicted in FIG. 1.

According to an embodiment, the dummy gate 410 is removed from the semiconductor structure 100. As known in the art, in a gate-last fabrication process, the removed dummy gate 410 is thereafter replaced with a high-k metal gate structure, i.e., replacement gate 1310. According to an embodiment, the second sacrificial semiconductor layers 110 (FIGS. 12A-12B) can now be removed from the semiconductor structure 100 using known etching processes including, for example, RIE, wet etch or dry gas (HCl). Removal of the sacrificial semiconductor layers 110 (FIGS. 12A-12B) create cavities (not shown) between the inner spacers 720 that will subsequently be filled with corresponding gate dielectric and work function metals to form the high-k metal gate structure or replacement gate 1310, as depicted in FIGS. 13B-13C.

The replacement gate 1310 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 13B, the replacement gate 1310 surrounds (stacked) semiconductor channel layers 112. In one or more embodiments, a gate cap (not shown) may be formed above the replacement gate 1310.

After forming the replacement gate 1310, a chemical mechanical polishing (CMP) may be conducted to remove excess material and polish upper surfaces of the semiconductor structure 100.

In one or more embodiments, a gate cut process can be conducted on the semiconductor structure 100 for isolating gate structures from different CMOS cells. During the process, a gate cut region 1315 can be formed either before replacement metal gate (RMG) or after RMG, and then filled with dielectrics such as $SiO_2$, SiN, SiBCN, SiOCN, SiOC, SiC, and the like, as depicted in FIG. 13B.

With continued reference to FIGS. 13A-13C, a plurality of conductive structures including metal contacts 1312 are formed in the semiconductor structure 100 for electrically connecting FEOL devices to subsequently formed metal levels. The process of forming the metal contacts 1312 is standard and well-known in the art. Typically, the process includes forming trenches (not shown) within the interlevel dielectric layer 1230 and subsequently filling the trenches with a conductive material or a combination of conductive materials to form the metal contacts 1312. In one or more embodiments, the conductive material filling the metal contacts 1312 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. Specifically, in the depicted example, metal contacts 1312 may include source/drain contacts (CA) that extend until an uppermost surface of source/drain regions 1220, as depicted in FIGS. 13A and 13C, and gate contacts (CB) to the replacement gate 1310, as depicted in FIG. 13B.

According to an embodiment, BEOL interconnect level 1320 is formed above, and electrically connected to, FEOL device level 30 of the semiconductor structure 100. Although not depicted in the figures, the BEOL interconnect level 1320 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1320, the semiconductor structure 100 (i.e., the semiconductor wafer) is bonded to the carrier wafer (or auxiliary substrate) 1322. The carrier wafer 1322 may act as a reinforcing substrate for providing mechanical strength during processing (e.g., thinning) of the semiconductor wafer. The process of bonding the semiconductor wafer to the carrier wafer 1322 can be achieved by conventional wafer bonding process, such as dielectric-to-dielectric bonding or Cu-to-Cu bonding.

Accordingly, the carrier wafer 1322 may include silicon oxide layers or SiCN layers, or any other layers applicable in the direct bonding technology applied in state of the art packaging techniques. Bonding of the device wafer to the carrier wafer 1322 takes place by such known direct bonding techniques, thus obtaining the assembly shown in FIGS. 13A-13C. Although not depicted in the figures, after bonding of the device wafer to the carrier wafer 1322 the wafer is flipped.

Figure 14A:
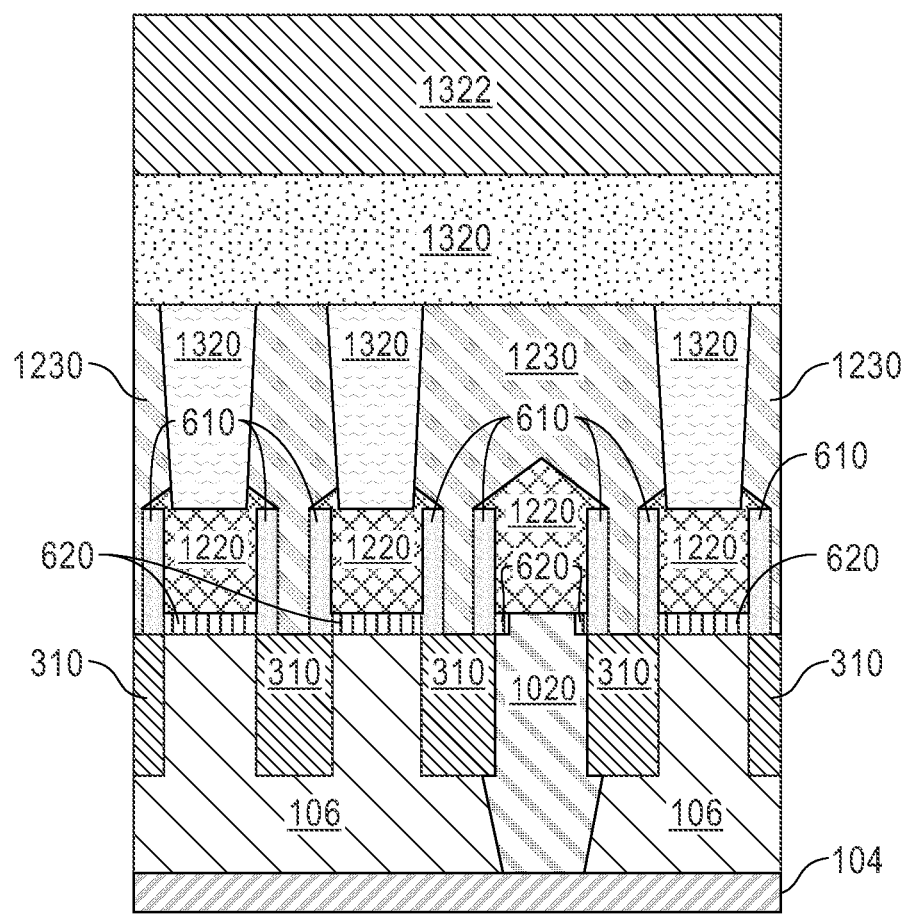
FIG. 14A is a cross-sectional view of the semiconductor structure taken along Y1-Y1', as shown in FIG. 1, depicting removing a semiconductor substrate, according to an embodiment of the present disclosure.

Referring now to FIGS. 14A-14C, cross-sectional views of the semiconductor structure 100 are shown after removal of the substrate 102 (FIGS. 13A-13C), according to an embodiment of the present disclosure. In this embodiment, FIG. 14A is a cross-sectional view of the semiconductor structure 100 taken along line Y1-Y1', as depicted in FIG. 1; FIG. 14B is a cross-sectional view of the semiconductor structure 100 taken along line Y2-Y2', as depicted in FIG. 1; and FIG. 14C is a cross-sectional view of the semiconductor structure 100 taken along line X-X', as depicted in FIG. 1.

In the depicted embodiment, after the wafer is flipped (not shown), the substrate 102 (FIGS. 13A-13C) can be removed using regular grinding, CMP and selective etching processes including wet or dry etching techniques. In one or more embodiments, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semiconductor structure 100. In the depicted embodiment, the first sacrificial layer 104 act as an etch stop during the highly selective Si removal process, preventing excessive Si etch which may damage the replacement gate 1310 and source/drain regions 1220.

Figure 15A:
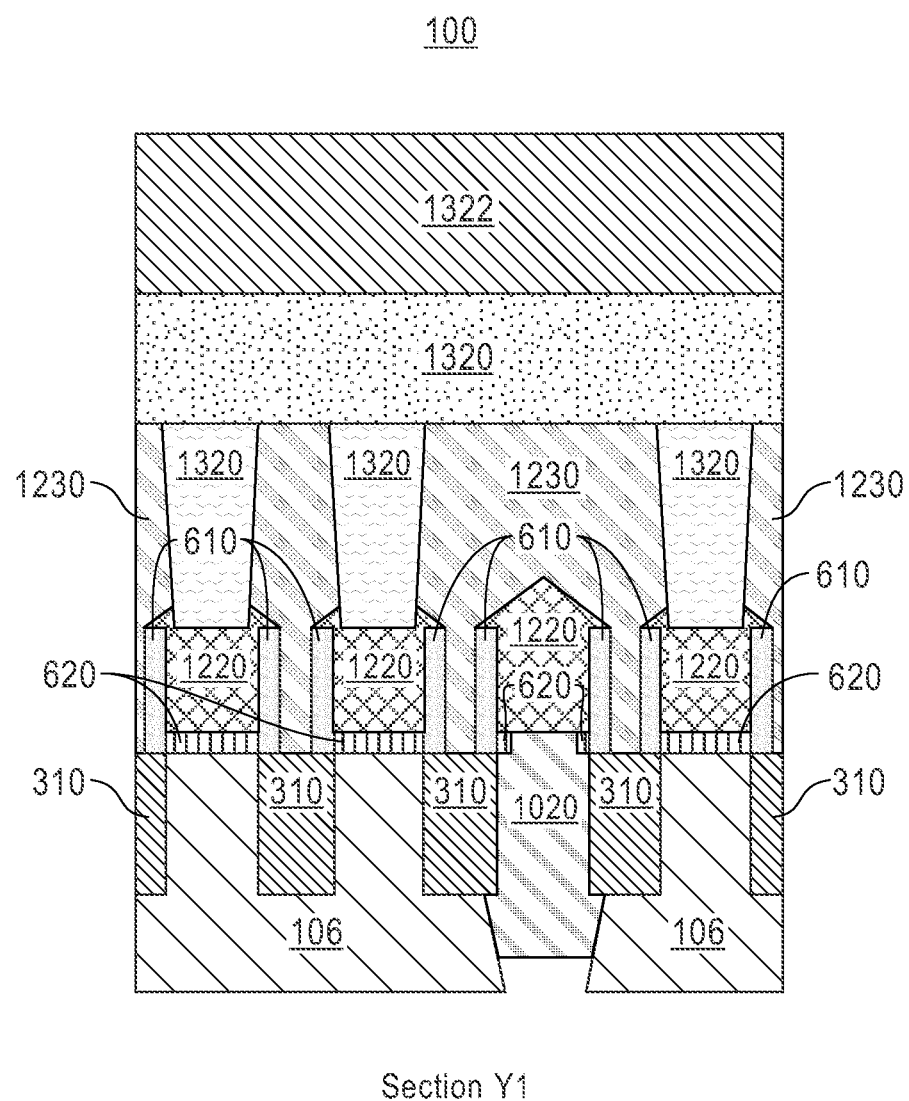
FIG. 15A is a cross-sectional view of the semiconductor structure taken along Y1-Y1', as shown in FIG. 1, depicting removing the first sacrificial layer and etching portions of the first semiconductor layer to expose the placeholder layer, according to an embodiment of the present disclosure.
Figure 15C:
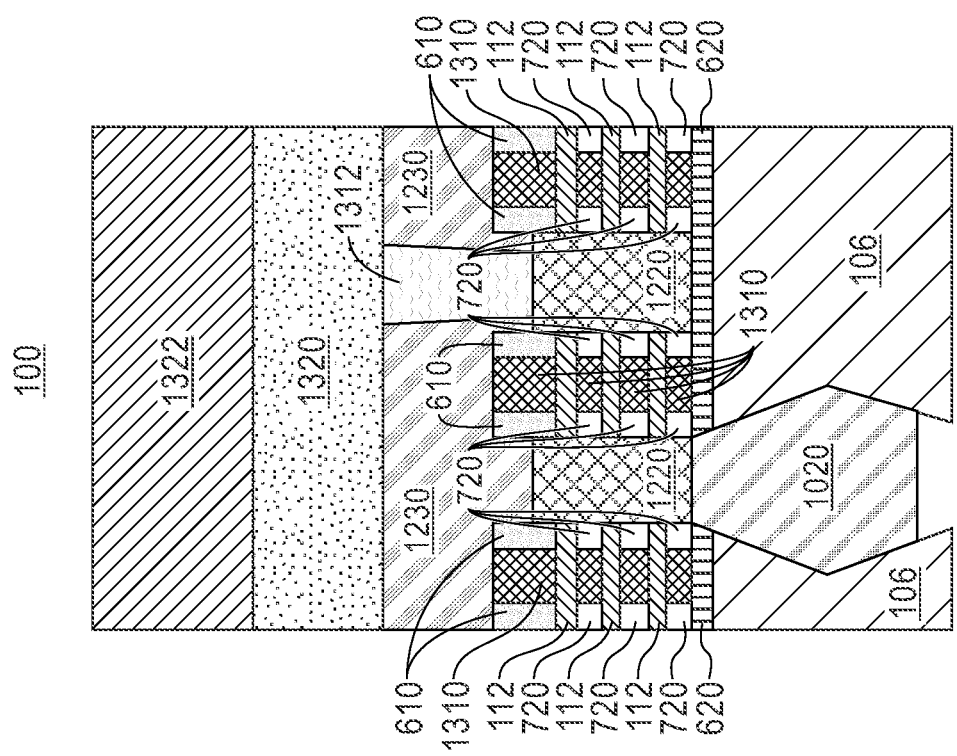
FIG. 15C is a cross-sectional view of the semiconductor structure taken along line X-X', according to an embodiment of the present disclosure.
Figure 15B:
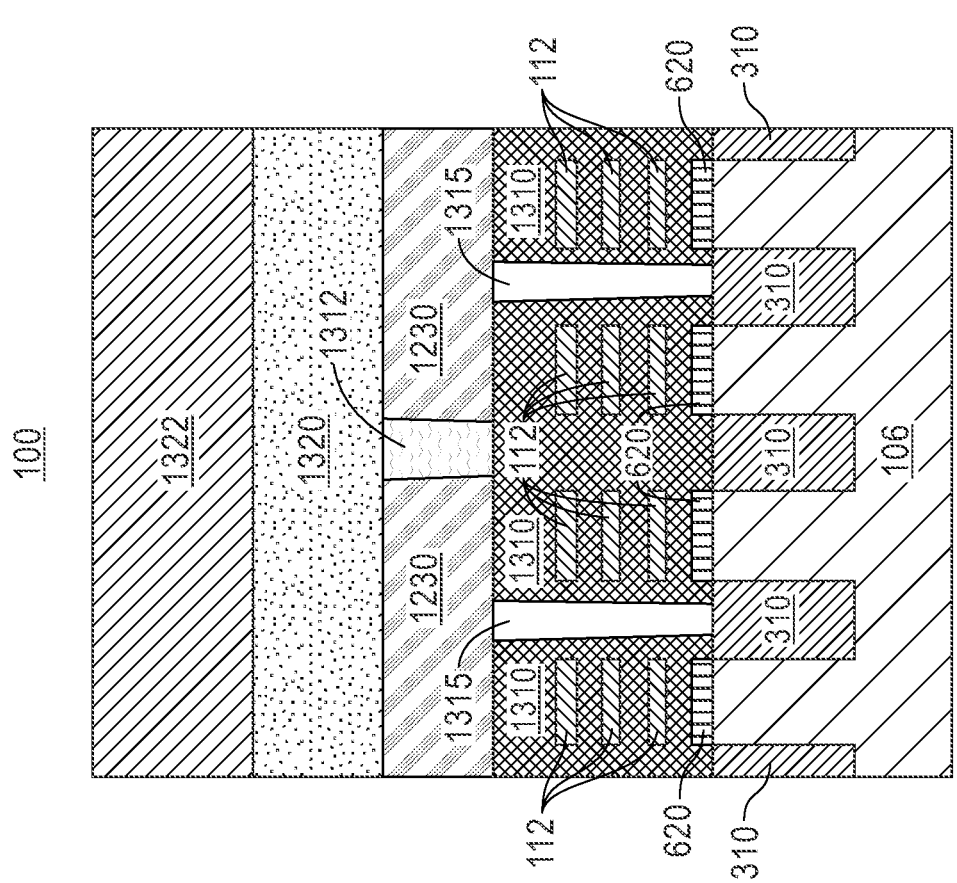
FIG. 15B is a cross-sectional view of the semiconductor structure taken along line Y2-Y2', as shown in FIG. 1, according to an embodiment of the present disclosure.

Referring now to FIGS. 15A-15C, cross-sectional views of the semiconductor structure 100 are shown after removing the first sacrificial layer 104 and etching portions of the first semiconductor layer 106 to expose the placeholder layer 1020, according to an embodiment of the present disclosure. In this embodiment, FIG. 15A is a cross-sectional view of the semiconductor structure 100 taken along line Y1-Y1', as depicted in FIG. 1; FIG. 15B is a cross-sectional view of the semiconductor structure 100 taken along line Y2-Y2', as depicted in FIG. 1; and FIG. 15C is a cross-sectional view of the semiconductor structure 100 taken along line X-X', as depicted in FIG. 1.

In the depicted embodiment, any suitable etching technique may be used to remove the first sacrificial layer 104 (FIGS. 14A-14C). In embodiments in which the first sacrificial layer 104 (FIGS. 14A-14C) is made of SiGe a hot SC1 or dry HCl etch can be used to remove the first sacrificial layer 104. In embodiments in which the first sacrificial layer 104 (FIGS. 14A-14C) is made of $SiO_2$, DHF wet clean can be used to remove the first sacrificial layer 104. As shown in FIG. 15A and FIG. 15C, some portion of the placeholder layer 1020 may also be etched during the removal of sacrificial layer 104.

Figure 16A:
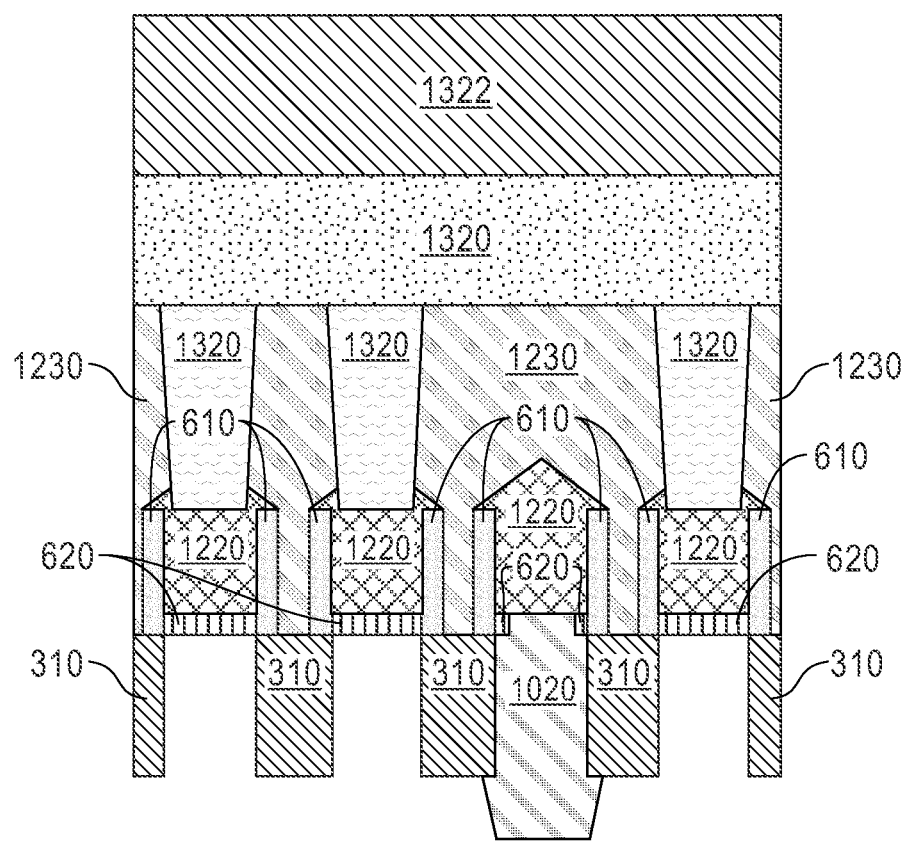
FIG. 16A is a cross-sectional view of the semiconductor structure taken along Y1-Y1', as shown in FIG. 1, depicting removing remaining Si-containing areas, according to an embodiment of the present disclosure.

Referring now to FIGS. 16A-16C, cross-sectional views of the semiconductor structure 100 are shown after removing remaining Si-containing areas, i.e., the first semiconductor layer 106 depicted in FIGS. 15A-15C, according to an embodiment of the present disclosure. In this embodiment, FIG. 15A is a cross-sectional view of the semiconductor structure 100 taken along line Y1-Y1', as depicted in FIG. 1; FIG. 15B is a cross-sectional view of the semiconductor structure 100 taken along line Y2-Y2', as depicted in FIG. 1; and FIG. 15C is a cross-sectional view of the semiconductor structure 100 taken along line X-X', as depicted in FIG. 1.

In this embodiment, a process similar to the one described in FIGS. 14A-14C for removing the substrate 102 can be conducted to remove the first semiconductor layer 106 (FIGS. 15A-15C) from the semiconductor structure 100. Selective removal of the first semiconductor layer 106 (FIGS. 15A-15C) exposes the placeholder layer 1020. As can be observed in FIG. 16A and FIG. 16C, a first or bottom surface of the placeholder layer 1020 is in contact with a first or bottom surface of the source/drain region 1220.

Figure 17A:
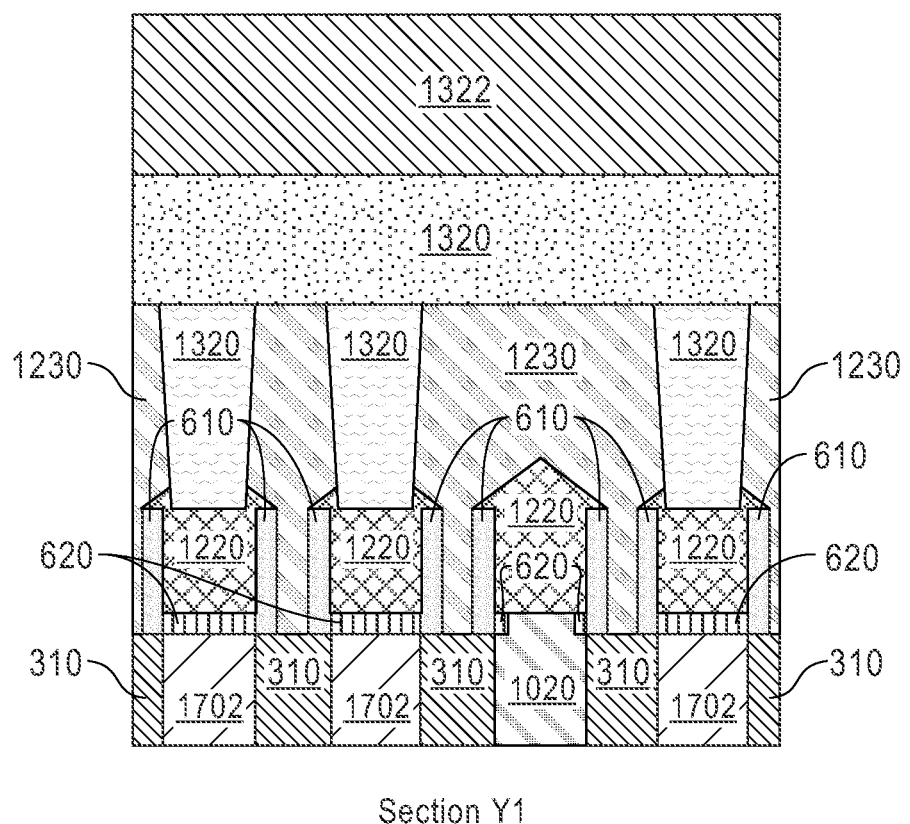
FIG. 17A is a cross-sectional view of the semiconductor structure taken along Y1-Y1', as shown in FIG. 1, depicting forming a first backside interlayer dielectric, according to an embodiment of the present disclosure.

Referring now to FIGS. 17A-17C, cross-sectional views of the semiconductor structure 100 are shown after forming a first backside interlayer dielectric (BILD) 1702, according to an embodiment of the present disclosure. In this embodiment, FIG. 17A is a cross-sectional view of the semiconductor structure 100 taken along line Y1-Y1', as depicted in FIG. 1; FIG. 17B is a cross-sectional view of the semiconductor structure 100 taken along line Y2-Y2', as depicted in FIG. 1; and FIG. 17C is a cross-sectional view of the semiconductor structure 100 taken along line X-X', as depicted in FIG. 1.

The first BILD 1702 is formed using standard methods and materials, such as those used to form the interlevel dielectric layer 1230 described above with reference to FIGS. 12A-12C. As depicted in FIGS. 17B-17C, the first BILD 1702 is disposed above the bottom dielectric isolation layer 620. In an exemplary embodiment, a thickness of the first BILD 1702 may vary between approximately 40 nm to approximately 300 nm, and ranges therebetween. In one or more embodiments, a planarization process (e.g., CMP) can be conducted on the semiconductor structure 100 after forming the first BILD 1702. After the planarization process, an exposed second surface or top surface of the placeholder layer 1020 opposing the first surface of the placeholder layer is substantially coplanar with the first BILD 1702 and STI regions 310.

Figure 18A:
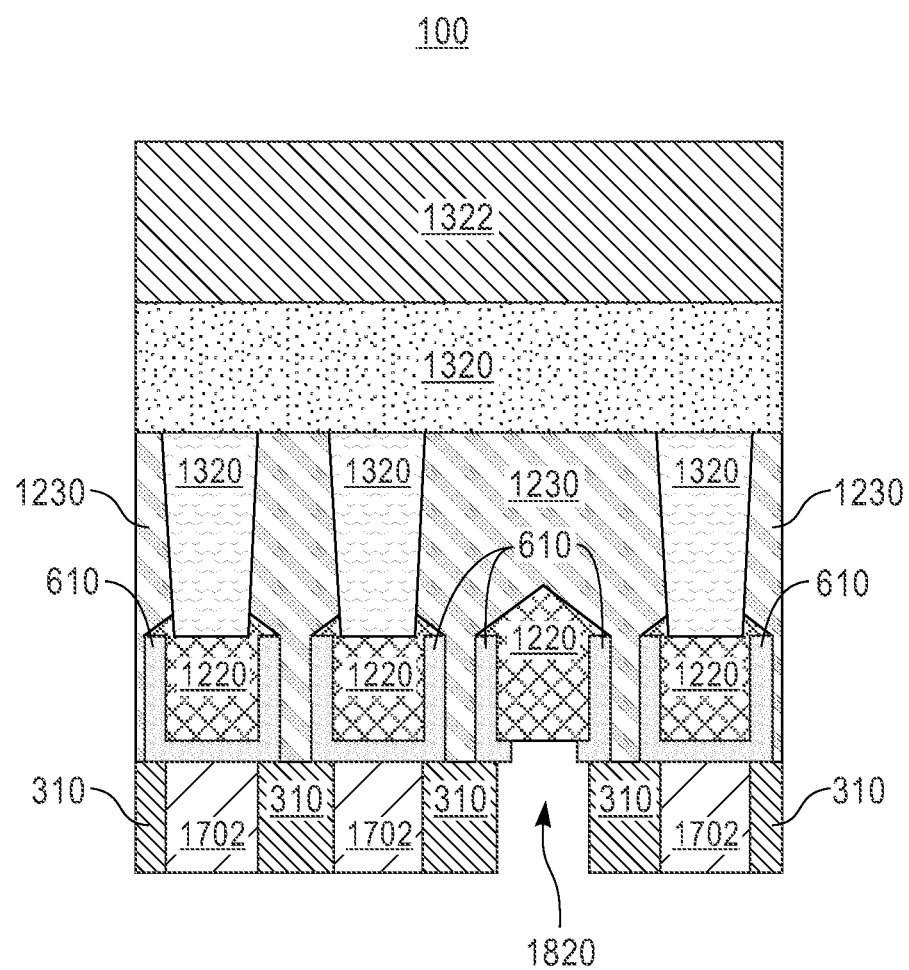
FIG. 18A is a cross-sectional view of the semiconductor structure taken along Y1-Y1', as shown in FIG. 1, depicting selectively removing the placeholder layer, according to an embodiment of the present disclosure.
Figure 18C:
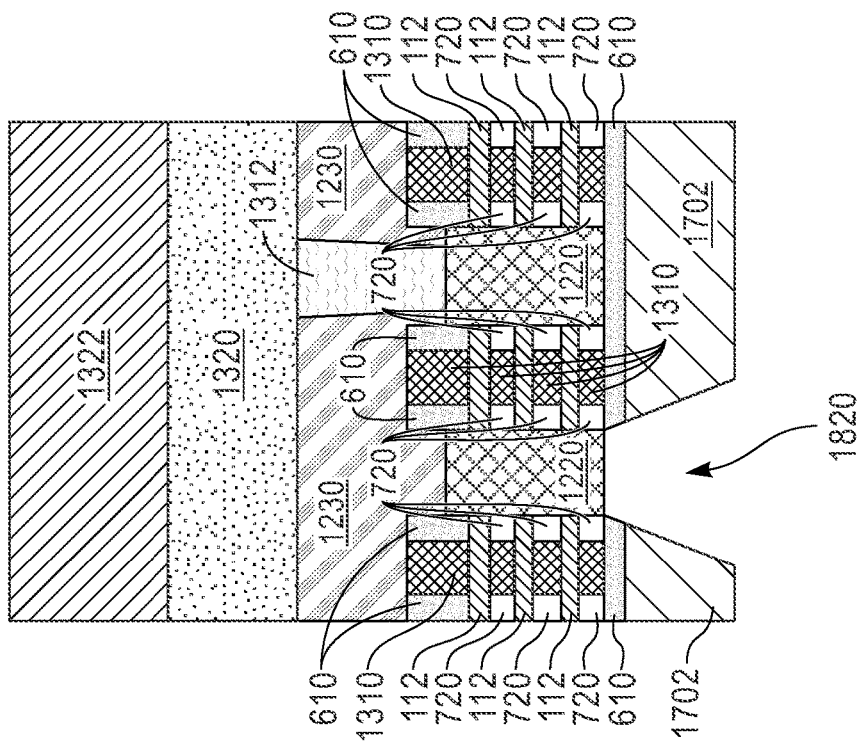
FIG. 18C is a cross-sectional view of the semiconductor structure taken along line X-X', according to an embodiment of the present disclosure.
Figure 18B:
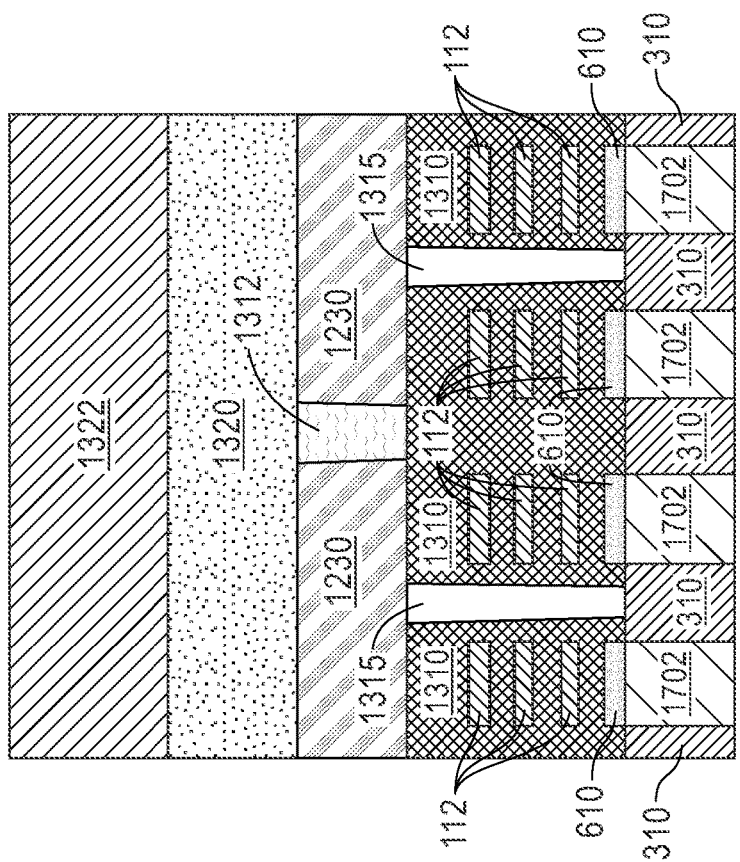
FIG. 18B is a cross-sectional view of the semiconductor structure taken along line Y2-Y2', as shown in FIG. 1, according to an embodiment of the present disclosure.

Referring now to FIGS. 18A-18C, cross-sectional views of the semiconductor structure 100 are shown after selectively removing placeholder layer 1020 (FIGS. 17A-17C), according to an embodiment of the present disclosure. In this embodiment, FIG. 18A is a cross-sectional view of the semiconductor structure 100 taken along line Y1-Y1', as depicted in FIG. 1; FIG. 18B is a cross-sectional view of the semiconductor structure 100 taken along line Y2-Y2', as depicted in FIG. 1; and FIG. 18C is a cross-sectional view of the semiconductor structure 100 taken along line X-X', as depicted in FIG. 1.

Removal of the placeholder layer 1020 (FIGS. 17A-17C) creates fourth openings 1820 in the semiconductor structure 100. Fourth openings 1820 (i.e., backside contact vias) expose one or more of the source/drain regions 1220, as depicted in FIGS. 18A and 18C. Exemplary techniques suitable for removing the placeholder layer 1020 (FIGS. 17A-17C) from the semiconductor structure 100 may include, but are not limited to, dry HCl etch which may cause minimal or no damage to the underlying layers.

As can be observed in FIGS. 18A and 18C, at least one of the fourth openings 1820 expose a top surface of a source/drain region 1220 adjacent to another source/drain region 1220 that is in electric contact with a metal contact 1312.

Figure 19A:
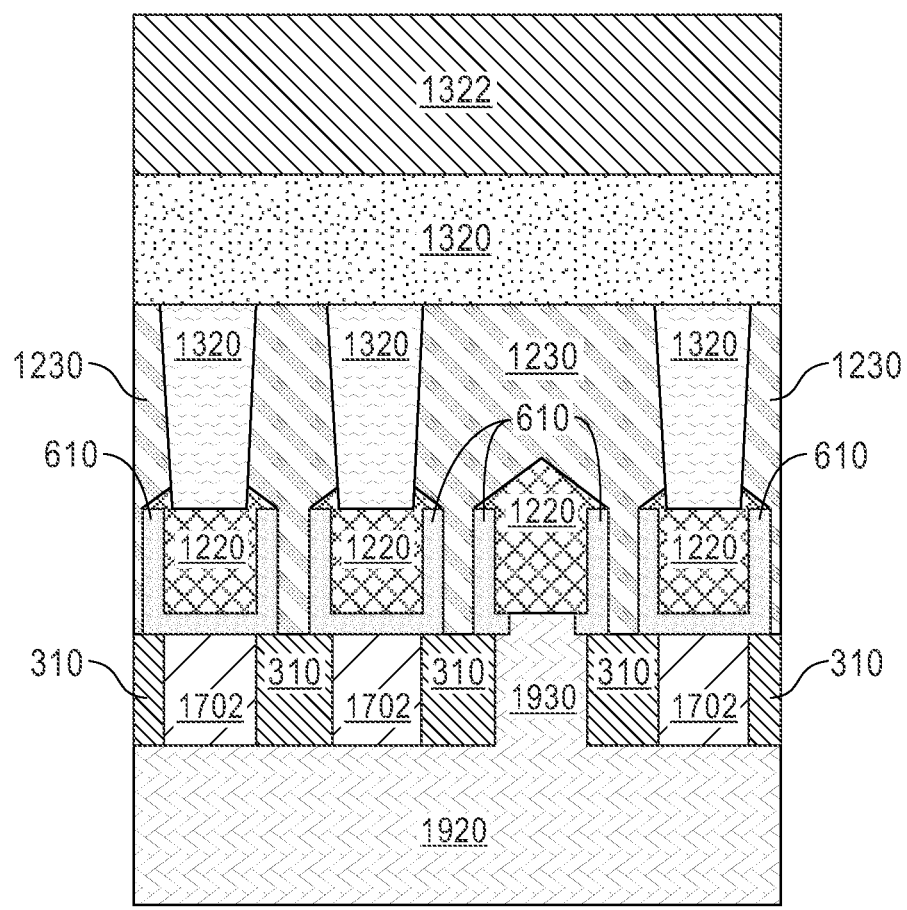
FIG. 19A is a cross-sectional view of the semiconductor structure taken along Y1-Y1', as shown in FIG. 1, depicting depositing a backside metal, according to an embodiment of the present disclosure.

Referring now to FIGS. 19A-19C, cross-sectional views of the semiconductor structure 100 are shown after depositing a backside metal 1920, according to an embodiment of the present disclosure. In this embodiment, FIG. 19A is a cross-sectional view of the semiconductor structure 100 taken along line Y1-Y1', as depicted in FIG. 1; FIG. 19B is a cross-sectional view of the semiconductor structure 100 taken along line Y2-Y2', as depicted in FIG. 1; and FIG. 19C is a cross-sectional view of the semiconductor structure 100 taken along line X-X', as depicted in FIG. 1.

The backside metal 1920 substantially fills fourth openings 1820 (FIGS. 18A-18C). A layer of the backside metal 1920 further deposits above the filled fourth openings 1820, above the first BILD 1702, and above STI regions 310, as depicted in the figures. It should be noted that the backside metal 1920 substantially filling the fourth openings 1820 (FIGS. 18A-18C) provides backside metal contacts 1930 to source/drain regions 1220. According to an embodiment, backside contacts 1930 may electrically connect the semiconductor structure 100 to a subsequently formed backside power rail (BPR), as will be described in detail below.

The backside metal 1920 may be formed using similar conductive materials and analogous deposition processes as those used to form the metal contacts 1102. In some embodiments, conductive metals for forming the backside metal 1920 may be selected according to subsequently formed backside power rail structures. In such instances the backside metal 1920 may be formed by depositing, for example, a silicide liner such as Ti, Ni, NiPt, an adhesion metal liner such as TiN, and a layer of low resistance metal, such as Ru, Co, W or Cu.

A thickness of the layer of backside material extending above the first BILD 1702 and STI regions 310 may vary from approximately 30 nm to approximately 200 nm, and ranges therebetween.

In one or more embodiments, backside contacts 1930 can be formed between neighboring source/drain regions 1220 located within NFET (i.e., N2N space) regions 12 (FIG. 1) or PFET (i.e., P2P space) regions 16 (FIG. 1) of the semiconductor structure 100. In the depicted embodiment, backside metal contact 1930 is formed in direct contact with the first or bottom surface of at least one source/drain region 1220.

Figure 20A:
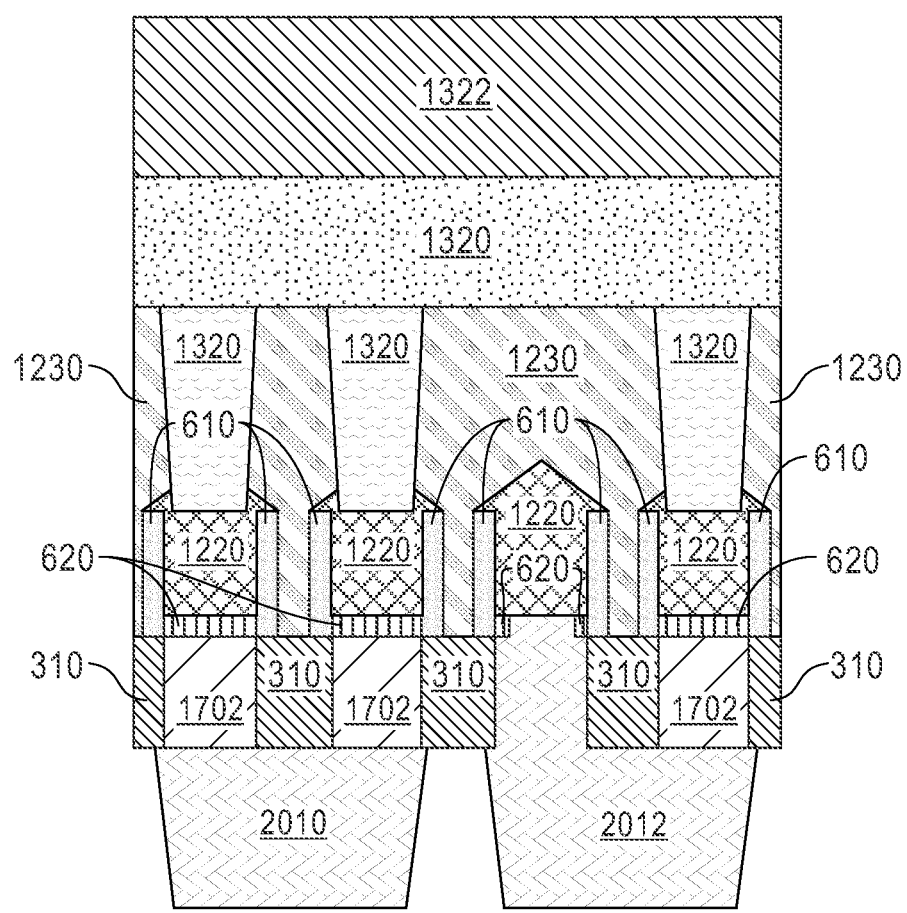
FIG. 20A is a cross-sectional view of the semiconductor structure taken along Y1-Y1', as shown in FIG. 1, depicting backside power rail patterning, according to an embodiment of the present disclosure.

Referring now to FIGS. 20A-20C, cross-sectional views of the semiconductor structure 100 are shown after backside power rail patterning, according to an embodiment of the present disclosure. In this embodiment, FIG. 20A is a cross-sectional view of the semiconductor structure 100 taken along line Y1-Y1', as depicted in FIG. 1; FIG. 20B is a cross-sectional view of the semiconductor structure 100 taken along line Y2-Y2', as depicted in FIG. 1; and FIG. 20C is a cross-sectional view of the semiconductor structure 100 taken along line X-X', as depicted in FIG. 1.

In the depicted embodiment, backside power rails (BPRs) 2010, 2012 are formed in the semiconductor structure 100 by patterning the backside metal 1920 (FIGS. 19A-19C) using subtractive metal etching. Specifically, hybrid damascene and subtractive metal patterning can be used to pattern the layer of backside metal 1920 (FIGS. 19A-19C) extending above first BILD 1702 and STI regions 310 to form BPRs 2010, 2012, as depicted in the figures. Thus, the present embodiments, may allow for simultaneously forming backside metal contacts (e.g., backside contact 1930) and backside power rails (e.g., BPRs 2010, 2012).

More particularly, in an embodiment, the semiconductor structure 100 includes an NFET device. In such embodiment, the BPR 2012 includes a VSS rail embedded in the NFET region of the semiconductor structure 100 for electrically connecting to an N-type source/drain region 1220 through a backside contact 1930 (located between adjacent N-type source/drain regions 1220). In other embodiments, the semiconductor structure 100 includes a PFET device in which the BPR 2010 may include a VDD rail embedded in the PFET region of the semiconductor structure 100 that is electrically connected to a (P-type) source/drain region 1220 through a backside contact 1930 (located between adjacent P-type source/drain regions 1220).

It should be noted that source/drain regions 1220 wired to backside power rails (i.e., BPRs 2010, 2012) are not connected to the BEOL interconnect level 1320. More particularly, as depicted in the figures, at least one backside power rail (i.e., BPRs 2010, 2012) electrically connects to a source/drain region 1220 of a transistor through the backside contact 1930, with the bottom dielectric isolation layer 620, first BILD 1702, and/or STI regions 310 in contact with remaining source/drain regions 1220 for electrically isolating the at least one backside power rail from the source/drain regions 1220 not electrically connected to the backside contact 1930.

Figure 21A:
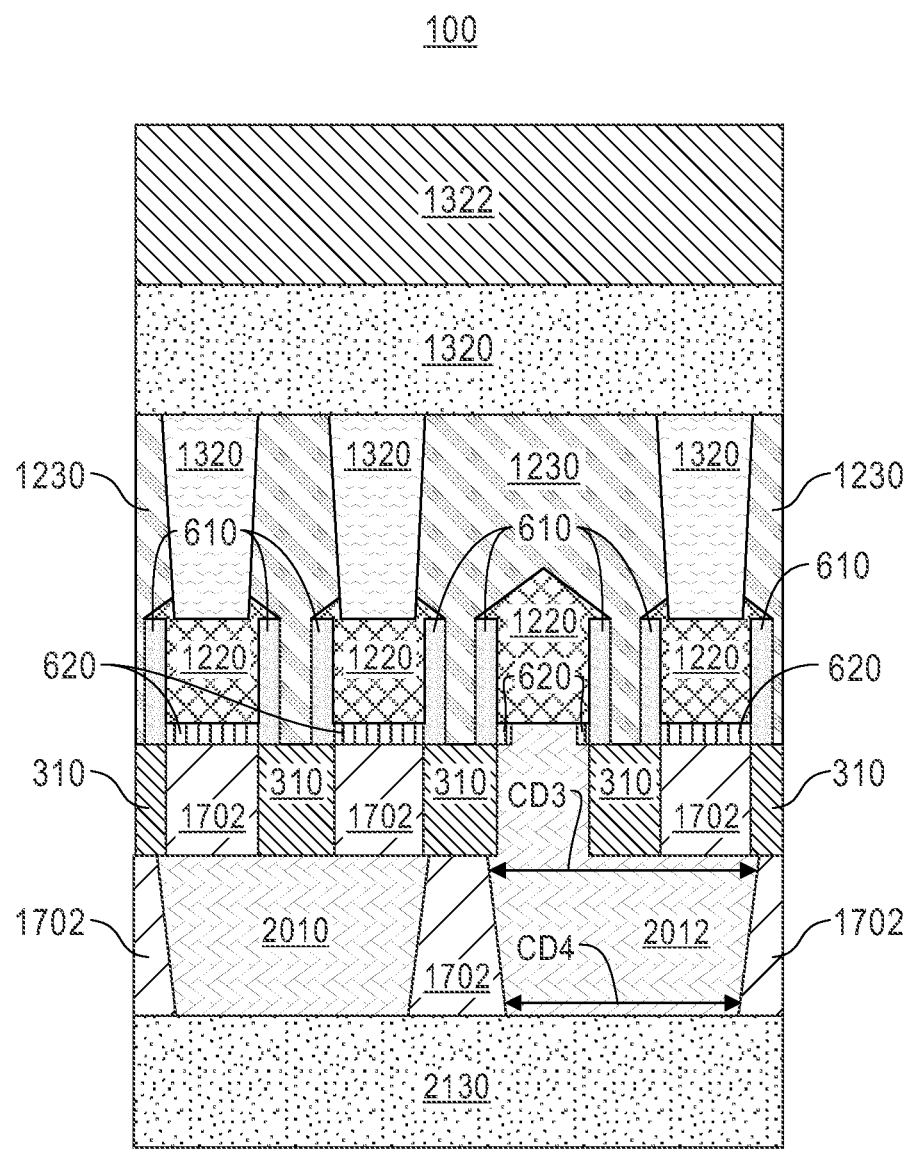
FIG. 21A is a cross-sectional view of the semiconductor structure taken along Y1-Y1', as shown in FIG. 1, depicting forming a backside power delivery network, according to an embodiment of the present disclosure.

After patterning the BPRs 2010, 2012, voids within the semiconductor structure may be filled by depositing a dielectric material substantially similar to the first BILD 1702. Thus, for simplicity another layer of first BILD 1702 is deposited within the semiconductor structure 100 to fill remaining voids and electrically isolate the BPRs 2010, 2012, as depicted in FIGS. 21A-21C below. A planarization process can be conducted in the semiconductor structure 100 after deposing the another layer of first BILD 1702.

Referring now to FIGS. 21A-21C, cross-sectional views of the semiconductor structure 100 are shown after forming a backside power delivery network (BSPDN) 2130, according to an embodiment of the present disclosure. In this embodiment, FIG. 21A is a cross-sectional view of the semiconductor structure 100 taken along line Y1-Y1', as depicted in FIG. 1; FIG. 21B is a cross-sectional view of the semiconductor structure 100 taken along line Y2-Y2', as depicted in FIG. 1; and FIG. 21C is a cross-sectional view of the semiconductor structure 100 taken along line X-X', as depicted in FIG. 1.

In one or more embodiments, a structure of the BSPDN 2130 can be made according to known techniques. Depending on the exact function of the transistor arrangement, a number of the source/drain regions 1220 may be connected to backside power and ground via the backside contact 1930. As mentioned above, the backside contact 1930 is a metal area placed between P-type source/drain regions (N2N space) and between N-type source/drain regions (N2N space), i.e., between source/drain regions of similar polarity. According to an embodiment, the backside contact 1930 is in contact with a bottom surface of the BPR 2010 or 2012 (depending on the polarity of the device), and embedded within an intermediate STI region 310 (located between same polarity regions).

It should be noted that the BEOL interconnect level 1320 in the semiconductor structure 100 manufactured according to the disclosed technology is separated from the BSPDN 2130, thereby increasing the routing resources in the semiconductor structure 100 for signal wirings in the BEOL level.

According to an embodiment, by conducting the sigma etch process, backside contact vias and hence backside metal contacts 1930 exhibit a first (positive) taper profile including a first tapering angle according to which a first or top critical dimension (CD1) of the backside metal contacts 1930 is less than a second or bottom critical dimension (CD2) of the backside metal contacts 1930, as shown in FIG. 21C. Similarly, BPRs 2010, 2012 are formed with a second (negative) taper profile different from the first taper profile of the backside metal contacts 1930. The second taper profile including a second tapering angle according to which a third or top critical dimension (CD3) of a BPR 2010, 2012 is larger than a fourth or bottom critical dimension (CD4) of each of the BPRs 2010, 2012.

Therefore, the previously described embodiments provide a semiconductor device including a field effect transistor (FET), and a backside contact 1930. The backside contact 1930 being electrically connected to a source/drain region 1220 of the FET and electrically connected to a backside power rail 2010, 2012. The backside contact 1930 having a first width that is adjacent to the source/drain region 1220 and a second width that is adjacent to the backside power rail 2010, 2012. The second width of the backside contact 1930 being larger than the first width of the backside contact 1930. According to an embodiment, the backside power rail 2010, 2012 has a third width adjacent to the backside contact 1930 and a fourth width at the opposite side of the backside contact 1930. The third width of the backside power rail 2010, 2012 being larger than the fourth width of the backside power rail 2010, 2012.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
 a plurality of source/drain regions within a field effect transistor;
 a backside metal contact electrically connected to at least one source/drain region of the plurality of source/drain regions, the backside metal contact including a first taper profile; and
 a backside power rail electrically connected to the at least one source/drain region through the backside metal contact, the backside power rail including a second taper profile, the second taper profile being different from the first taper profile, the backside power rail and the backside metal contact being formed from a single deposition of a layer of backside metal over a backside interlayer dielectric and into a backside contact via, the backside power rail defined by subtractive metal patterning of the layer of backside metal.

2. The semiconductor structure of claim 1, further comprising:
 a front-end-of-line level including the field effect transistor, the front-end-of-line level being electrically connected to a back-end-of-line interconnect level located on a first side of the front-end-of-line level;
 a plurality of shallow trench isolation regions located between adjacent field effect transistors;
 a backside interlayer dielectric surrounding the backside power rail and located on a second side of the front-end-of-line level opposing the first side of the front-end-of-line level; and
 a metal contact within an interlevel dielectric layer, the metal contact being in electric contact with a bottom portion of at least another source/drain region.

3. The semiconductor structure of claim 2, further comprising:
 a carrier wafer in contact with a surface of the back-end-of-line interconnect level opposing the plurality of source/drain regions and the metal contact.

4. The semiconductor structure of claim 1, wherein the first taper profile of the backside metal contact includes a first critical dimension of the backside metal contact being less than a second critical dimension of the backside metal contact.

5. The semiconductor structure of claim 4, wherein the first critical dimension is a top critical dimension of the backside metal contact and the second critical dimension is a bottom critical dimension of the backside metal contact.

6. The semiconductor structure of claim 1, wherein the second taper profile includes a third critical dimension of the backside power rail being larger than a fourth critical dimension of the backside power rail.

7. The semiconductor structure of claim 6, wherein the third critical dimension is a top critical dimension of the backside power rail and the fourth critical dimension is a bottom critical dimension of the backside power rail.

8. The semiconductor structure of claim 1, wherein the backside metal contact and the backside power rail are composed of a conductive material including at least one of Ru, Cu, Co, W, and Al.

9. The semiconductor structure of claim 1, further comprising:
a power delivery network above and in electric contact with the backside power rail.

10. The semiconductor structure of claim 1, wherein the field effect transistor includes at least one of a P-field effect transistor and an N-field effect transistor, and wherein the field effect transistor includes a nanosheet field effect transistor.

11. A method of forming a semiconductor structure, comprising:
forming a plurality of source/drain regions within a field effect transistor;
forming a backside metal contact electrically connected to at least one source/drain region of the plurality of source/drain regions, the backside metal contact including a first taper profile; and
forming a backside power rail electrically connected to the at least one source/drain region through the backside metal contact, the backside power rail including a second taper profile, the second taper profile being different from the first taper profile, wherein forming the backside metal contact and the backside power rail comprises depositing a layer of backside metal over a backside interlayer dielectric and into a backside contact via, and patterning the layer of backside metal to define the backside power rail.

12. The method of claim 11, further comprising:
forming a front-end-of-line level including the field effect transistor, the front-end-of-line level being electrically connected to a back-end-of-line interconnect level located on a first side of the front-end-of-line level;
forming a plurality of shallow trench isolation regions between adjacent field effect transistors;
forming a backside interlayer dielectric surrounding the backside power rail and on a second side of the front-end-of-line level opposing the first side of the front-end-of-line level; and
forming a metal contact within an interlevel dielectric layer, the metal contact being in electric contact with a bottom portion of at least another source/drain region.

13. The method of claim 12, further comprising:
forming a carrier wafer in contact with a surface of the back-end-of-line interconnect level opposing the plurality of source/drain regions and the metal contact.

14. The method of claim 11, wherein the first taper profile of the backside metal contact includes a first critical dimension of the backside metal contact being less than a second critical dimension of the backside metal contact.

15. The method of claim 14, wherein the first critical dimension is a top critical dimension of the backside metal contact and the second critical dimension is a bottom critical dimension of the backside metal contact.

16. The method of claim 11, wherein the second taper profile includes a third critical dimension of the backside power rail being larger than a fourth critical dimension of the backside power rail.

17. The method of claim 16, wherein the third critical dimension is a top critical dimension of the backside power rail and the fourth critical dimension is a bottom critical dimension of the backside power rail.

18. The method of claim 11, wherein the backside metal contact and the backside power rail are composed of a conductive material including at least one of Ru, Cu, Co, W, and Al.

19. The method of claim 11, further comprising:
forming a power delivery network above and in electric contact with the backside power rail.

20. The method of claim 11, wherein the field effect transistor includes at least one of a P-field effect transistor and an N-field effect transistor, and wherein the field effect transistor includes a nanosheet field effect transistor.

* * * * *